US007279732B2

(12) United States Patent
Meng et al.

(10) Patent No.: US 7,279,732 B2
(45) Date of Patent: Oct. 9, 2007

(54) ENHANCED ATOMIC LAYER DEPOSITION

(75) Inventors: Shuang Meng, Boise, ID (US); Garo J. Derderian, Boise, ID (US); Gurtej Singh Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/854,593

(22) Filed: May 26, 2004

(65) Prior Publication Data
US 2004/0217410 A1    Nov. 4, 2004

Related U.S. Application Data

(62) Division of application No. 10/229,338, filed on Aug. 26, 2002, now Pat. No. 6,967,154.

(51) Int. Cl.
| H01L 27/108 | (2006.01) |
| H01L 29/76 | (2006.01) |
| H01L 29/94 | (2006.01) |
| H01L 31/119 | (2006.01) |
| H01L 23/48 | (2006.01) |
| H01L 23/52 | (2006.01) |
| H01L 29/40 | (2006.01) |

(52) U.S. Cl. ............ 257/301; 257/306; 257/783; 257/751; 257/761; 257/757; 257/304

(58) Field of Classification Search ........ 257/301, 257/306, 751, 783, 411, 295, 410, 761, 757, 257/304
See application file for complete search history.

(56) References Cited

U.S. PATENT DOCUMENTS

| 3,381,114 | A | 4/1968 | Nakanuma .......... 219/385 |
| 4,058,430 | A | 11/1977 | Suntola et al. ...... 427/255.13 |
| 4,215,156 | A | 7/1980 | Dalal et al. ............ 427/84 |
| 4,333,808 | A | 6/1982 | Bhattacharyya et al. .......... 204/192 D |
| 4,389,973 | A | 6/1983 | Suntola et al. ......... 118/725 |
| 4,399,424 | A | 8/1983 | Rigby .................... 338/34 |
| 4,413,022 | A | 11/1983 | Suntola et al. ........ 427/255.2 |
| 4,590,042 | A | 5/1986 | Drage ............... 422/186.06 |

(Continued)

FOREIGN PATENT DOCUMENTS

JP          62-199019          9/1987

(Continued)

OTHER PUBLICATIONS

Forsgren, Katarina , "Atomic Layer Deposition of HfO2 using hafnium iodide", *Conference held in Monterey, California*, (May 2001), 1 page.

(Continued)

*Primary Examiner*—Walter L Lindsay, Jr.
(74) *Attorney, Agent, or Firm*—Schwegman, Lundberg & Woessner, P.A.

(57) ABSTRACT

A method of enhanced atomic layer deposition is described. In an embodiment, the enhancement is the use of plasma. Plasma begins prior to flowing a second precursor into the chamber. The second precursor reacts with a prior precursor to deposit a layer on the substrate. In an embodiment, the layer includes at least one element from each of the first and second precursors. In an embodiment, the layer is TaN. In an embodiment, the precursors are $TaF_5$ and $NH_3$. In an embodiment, the plasma begins during the purge gas flow between the pulse of first precursor and the pulse of second precursor. In an embodiment, the enhancement is thermal energy. In an embodiment, the thermal energy is greater than generally accepted for ALD (>300 degrees Celsius). The enhancement assists the reaction of the precursors to deposit a layer on a substrate.

43 Claims, 10 Drawing Sheets

U.S. PATENT DOCUMENTS

| | | | | |
|---|---|---|---|---|
| 4,647,947 | A | 3/1987 | Takeoka et al. | 346/135.1 |
| 4,757,360 | A | 7/1988 | Faraone et al. | 357/23.5 |
| 4,767,641 | A | 8/1988 | Kieser et al. | 427/38 |
| 4,815,962 | A | 3/1989 | Cardone | 427/525 |
| 4,920,071 | A | 4/1990 | Thomas | 437/188 |
| 4,947,221 | A | 8/1990 | Stewart et al. | 357/23.5 |
| 4,993,358 | A | 2/1991 | Mahawili | 118/715 |
| 5,006,192 | A | 4/1991 | Deguchi | 156/345 |
| 5,080,928 | A | 1/1992 | Klinedinst et al. | 427/70 |
| 5,091,207 | A | 2/1992 | Tanaka | 427/8 |
| 5,198,029 | A | 3/1993 | Dutta et al. | 118/303 |
| 5,262,199 | A | 11/1993 | Desu et al. | 427/255.32 |
| 5,429,966 | A | 7/1995 | Wu et al. | 437/43 |
| 5,595,606 | A | 1/1997 | Fujikawa et al. | 118/725 |
| 5,698,022 | A | 12/1997 | Glassman et al. | |
| 5,735,960 | A | 4/1998 | Sandhu et al. | 118/723 IR |
| 5,795,808 | A | 8/1998 | Park | 438/301 |
| 5,801,105 | A | 9/1998 | Yano et al. | 438/785 |
| 5,810,923 | A | 9/1998 | Yano et al. | 117/84 |
| 5,822,256 | A | 10/1998 | Bauer et al. | 365/200 |
| 5,828,080 | A | 10/1998 | Yano et al. | 257/43 |
| 5,840,897 | A | 11/1998 | Kirlin et al. | 546/2 |
| 5,855,675 | A | 1/1999 | Doering et al. | 118/719 |
| 5,879,459 | A | 3/1999 | Gadgil et al. | 118/715 |
| 5,916,365 | A | 6/1999 | Sherman | 117/92 |
| 5,950,925 | A | 9/1999 | Fukunaga et al. | 239/132.3 |
| 5,972,430 | A | 10/1999 | DiMeo, Jr. et al. | 427/255.32 |
| 6,013,553 | A | 1/2000 | Wallace et al. | 438/287 |
| 6,015,590 | A | 1/2000 | Suntola et al. | 427/255.23 |
| 6,020,024 | A | 2/2000 | Maiti et al. | 427/248.1 |
| 6,027,961 | A | 2/2000 | Maiti et al. | 438/199 |
| 6,057,271 | A | 5/2000 | Kenjiro et al. | 505/475 |
| 6,059,885 | A | 5/2000 | Ohashi et al. | 118/730 |
| 6,110,529 | A | 8/2000 | Gardiner et al. | 427/250 |
| 6,161,500 | A | 12/2000 | Kopacz et al. | 118/723 E |
| 6,171,900 | B1 | 1/2001 | Sun | 438/240 |
| 6,174,377 | B1 | 1/2001 | Doering et al. | 118/729 |
| 6,200,893 | B1 | 3/2001 | Sneh | 438/685 |
| 6,203,613 | B1 | 3/2001 | Gates et al. | 117/104 |
| 6,206,972 | B1 | 3/2001 | Dunham | 118/715 |
| 6,211,035 | B1 | 4/2001 | Moise et al. | 438/396 |
| 6,225,168 | B1 | 5/2001 | Gardner et al. | 438/287 |
| 6,281,144 | B1 | 8/2001 | Cleary et al. | 438/780 |
| 6,297,539 | B1 | 10/2001 | Ma et al. | 257/410 |
| 6,302,964 | B1 | 10/2001 | Umotoy et al. | 118/715 |
| 6,303,481 | B2 | 10/2001 | Park | 438/591 |
| 6,325,017 | B1 | 12/2001 | DeBoer et al. | 118/723 |
| 6,342,277 | B1 | 1/2002 | Sherman | 427/562 |
| 6,348,386 | B1 | 2/2002 | Gilmer | 438/288 |
| 6,360,685 | B1 | 3/2002 | Xia et al. | 118/723 ME |
| 6,368,941 | B1 | 4/2002 | Chen et al. | 438/424 |
| 6,380,579 | B1 | 4/2002 | Nam et al. | 257/306 |
| 6,383,955 | B1 | 5/2002 | Matsuki | 438/790 |
| 6,387,712 | B1 | 5/2002 | Yano et al. | 438/3 |
| 6,391,769 | B1 | 5/2002 | Lee et al. | 438/643 |
| 6,410,432 | B1 | 6/2002 | Hautala et al. | 438/680 |
| 6,420,279 | B1 | 7/2002 | Ono et al. | 438/785 |
| 6,432,779 | B1 | 8/2002 | Hobbs et al. | 438/287 |
| 6,444,039 | B1 | 9/2002 | Nguyen | 118/715 |
| 6,444,895 | B1 | 9/2002 | Nikawa | 136/212 |
| 6,445,023 | B1 | 9/2002 | Vaartstra et al. | 257/295 |
| 6,448,192 | B1 | 9/2002 | Kaushik | 438/785 |
| 6,458,701 | B1 | 10/2002 | Chae et al. | 438/680 |
| 6,468,924 | B2 | 10/2002 | Lee et al. | 438/763 |
| 6,475,276 | B1 | 11/2002 | Elers et al. | 117/84 |
| 6,482,733 | B2 | 11/2002 | Raaijmakers et al. | 438/633 |
| 6,482,740 | B2 | 11/2002 | Soininen et al. | 438/686 |
| 6,486,047 | B2 | 11/2002 | Lee et al. | 438/513 |
| 6,495,436 | B2 | 12/2002 | Ahn et al. | 438/591 |
| 6,514,828 | B2 | 2/2003 | Ahn et al. | 438/297 |
| 6,521,911 | B2 | 2/2003 | Parsons et al. | 257/52 |
| 6,524,952 | B1 | 2/2003 | Srinivas et al. | 438/649 |
| 6,534,395 | B2 | 3/2003 | Werkhoven et al. | 438/627 |
| 6,534,420 | B2 | 3/2003 | Ahn et al. | 438/768 |
| 6,551,399 | B1 | 4/2003 | Sneh et al. | 117/102 |
| 6,576,053 | B1 | 6/2003 | Kim et al. | 117/89 |
| 6,590,251 | B2 | 7/2003 | Kang et al. | 400/479 |
| 6,605,549 | B2 | 8/2003 | Leu et al. | 473/342 |
| 6,617,634 | B2 | 9/2003 | Marsh et al. | 60/276 |
| 6,620,670 | B2 | 9/2003 | Song et al. | |
| 6,630,201 | B2 * | 10/2003 | Chiang et al. | 427/255.28 |
| 6,656,282 | B2 * | 12/2003 | Kim et al. | 118/695 |
| 6,723,642 | B1 | 4/2004 | Lim et al. | 438/680 |
| 6,727,169 | B1 | 4/2004 | Raaijmakers et al. | 438/622 |
| 6,737,317 | B2 * | 5/2004 | Marsh et al. | 257/301 |
| 6,967,154 | B2 | 11/2005 | Meng et al. | |
| 2001/0009695 | A1 | 7/2001 | Saanila et al. | 427/255.39 |
| 2001/0048981 | A1 | 12/2001 | Suzuki | 427/569 |
| 2001/0050039 | A1 | 12/2001 | Park | 117/102 |
| 2002/0089023 | A1 | 7/2002 | Yu et al. | 257/411 |
| 2002/0146916 | A1 | 10/2002 | Irino et al. | 438/785 |
| 2002/0155688 | A1 | 10/2002 | Ahn et al. | 438/592 |
| 2002/0155689 | A1 | 10/2002 | Ahn et al. | 29/76 |
| 2002/0160125 | A1 | 10/2002 | Johnson | 427/569 |
| 2002/0192974 | A1 | 12/2002 | Ahn et al. | 438/722 |
| 2003/0017717 | A1 | 1/2003 | Ahn et al. | 438/768 |

FOREIGN PATENT DOCUMENTS

| | | |
|---|---|---|
| JP | 5090169 | 4/1993 |
| JP | 2001-332546 | 11/2001 |

OTHER PUBLICATIONS

Forsgren, Katarina , "CVD and ALD of Group IV-and V-Oxides for Dielectric Applications", *Comprehensive Summaries of Uppsala Dissertation from the Faculty of Science and Techonology*, 665, (2001).

Aarik, Jaan, et al., "Atomic layer growth of epitaxial TiO/sub 2/ thin films from TiCl/sub 4/ and H/sub 2/O on alpha -Al/sub 2/O/sub 3/ substrates", *Journal of Crystal Growth*, 242(1-2), (2002), 189-198.

Aarik, Jaan , et al., "Influence of substrate temperature on atomic layer growth and properties of HfO/sub 2/ thin films", *Thin Solid Films*, 340(1-2), (1999),110-116.

Aarik, Jaan , et al., "Phase transformations in hafnium dioxide thin films grown by atomic layer doposition at high temperatures", *Applied Surface Science*, 173(1-2), (Mar. 2001),15-21.

Aarik, Jaan , et al., "Texture Development in nanocrystalline hafnium dioxide thin films grown by atomic layer deposition", *Journal of Crystal Growth*, 220, (2000),105-113.

Ahn, Kie Y., et al., "Highly Reliable Amorphous High-K Gate Oxide ZrO2", (May 17, 2001),3 pages.

Alen, Petra, "Atomic Layer depostiion of Ta(Al)N(C) thin films using trimethylaluminum as a reducing agent", *Journal of the Electrochemical Society*, 148(10), (Oct. 2001), G566-G571.

Bendoraitis, J G., et al., "Optical energy gaps in the monoclinic oxides of hafnium and zirconium and their solid solutions", *Journal of Physical Chemistry*, 69(10), (1965),3666-3667.

Bright, A A., et al., "Low-rate plasma oxidation of Si in a dilute oxygen/helium plasma for low-temperature gate quality Si/Sio2 interfaces", *Applied Physics Letters*, 58(6), (Feb. 1991),619-621.

Bunshah, Rointan F., et al., "Deposition Technologies for Films and Coatings: Developments and Applications", *Park Ridge, N.J., U.S. A. : Noyes Publications*, (1982),102-103.

Cava, R J., et al., "Improvement of the dielectric properties of Ta/sub 2/O/sub 5/ through substitution with Al/sub 2/O/sub 3/", *Applied Physics Letters*, 70(11), (Mar. 1997),1396-8.

Cheng, Baohong , et al., "The Impact of High-k Gate Dielectrics and Metal Gate Electrodes on Sub-100nm MOSFET's ", *IEEE Transactions on Electron Devices*, 46(7), (Jul. 1999),1537-1544.

Copel, M. , et al., "Structure and stability of ultrathin zirconium oxide layers on Si(001)", *Applied Physics Letters*, 76(4), (Jan. 2000),436-438.

De Flaviis, Franco, et al., "Planar microwave integrated phase-shifter design with high purity ferroelectric material", *IEEE Transactions on Microwave Theory & Techniques*, 45(6), (Jun. 1997),963-969.

Desu, S B., "Minimization of Fatigue in Ferroelectric Films", *Physica Status Solidi A*, 151(2), (1995),467-480.

Dusco, C, et al., "Depostiion of tin oxide into porous sillicon by atomic layer epitaxy", *Journal of the Electrochemical Society*, 143, (1996),683-687.

El-Kareh, B, et al., "The evolution of DRAM cell technology", *Solid State Technology*, 40(5), (1997),89-90, 92, 95-6, 98, 100-1.

Engelhardt, M., "Modern Applications of Plasma Etching and Patterning in Silicon Process Technology", *Contributions to Plasma Physics*, 39(5), (1999), 473-478.

Fong, Y., et al., "Oxides Grown on textured Single-Crystal Silicon—Dependence on Porcess and Application in EEPROMs", *IEEE Transactions on Electron Devices*, 37(3), (Marc. 1990),pp. 583-590.

Fuyuki, Takashi, et al., "Electronic Properties of the Interface between Si and TiO2 Deposited at Very Low Temperatures", *Japanese Journal of Applied Physics*, 25(9), (1986),1288-1291.

Fuyuki, Takashi, et al., "Initial stage of ultra-thin SiO/sub 2/ formation at low temperatures using activated oxygen", *Applied Surface Science*, 117-118, (Jun. 1997),123-126.

Gartner, M, et al., "Spectroellipsometric characterization of Ianthanide-doped TiO2 films obtained via the sol-gel technique", *Thin Solid Films*, 234(1-2), (1993),561-565.

Gasser, Werner, et al., "Quasi-Monolayer deposition of silicon dioxide", *Thin Solid Film*, 250(1-2), (1994),213-218.

Geller, S., et al., "Crystallographic Studies of Perovskite-like Compounds. II. Rare Earth Aluminates", *Acta Cryst.*,9, (May 1956),1019-1025.

Geusic, J., et al., "Structured Silicon Surfaces and Tunnel Oxides for Flash Memory Devices", *Micron Disclosure*, (Sep. 25, 1997).

Giess, E. A., et al., "Lanthanide gallate perovskite-type substrates for epitaxial, high-T/sub c/ superconducting Ba/sub 2/YCu/sub 3/O/sub 7-delta / films",*IBM Journal of Research and Development*, 34(6), (Nov. 1990),916-926.

Gusev, E P., et al., "Ultrathin High-K Dielectrics Grown by Atomic Layer Deposition: A Comparative Study of ZrO2, HfO2, Y2O3 and Al2O3", *Electrochemical Society Proceedings* vol. 2001-9, (2001),189-195.

Gutowski, M J., "Thermodynamic stability of high-K dielectric metal oxides ZrO/sub 2/ and HfO/sub 2/ in contact with Si and SiO/sub 2/", *Applied Physics Letters*, 80(11), (Mar. 18, 2002), 1897-1899.

Hao, M. Y., et al., "Electrical Characteristics of Oxynitrides Grown on Textured Single-Crystal Silicon", *Appl. Phys. Lett.*, 60, (Jan. 1992),445-447.

Hirayama, Masaki, et al., "Low-Temperature Growth of High-Integrity Silicon Oxide Films by Oxygen Radical Generated in High Density Krypton Plasma", *International Electron Devices Meeting 1999. Technical Digest*, (1999),249-252.

Hubbard, K. J., et al., "Thermodynamic stability of binary oxides in contact with silicon", *Journal of Materials Research*, 11(11), (Nov. 1996),2757-2776.

Hunt, C. E., et al., "Direct bonding of micromachined silicon wafers for laser diode heat exchanger applications", *Journal of Micromechanics and Microengineering*, 1(3), (Sep. 1991),152-156.

Iddles, D M., et al., "Relationships between dopants, microstructure and the microwave dielectric properties of ZrO2-TiO2-SnO2 ceramics", *Journal of Materials Science*, 27(23), (Dec. 1992),6303-6310.

Jeon, Sanghun, et al., "Excellent electrical characteristics of lanthanide (Pr, Nd, Sm, Gd, and Dy) oxide and lanthanide-doped oxide for MOS gate dietectric applications", *Electron Devices Meeting, 2001. IEDM Technical Digest International*, (2001),471-474.

Jeong, Chang-Wook, et al., "Plasma-Assisted Atomic layer Growth of High-Quality Aluminum Oxide Thin Films", *Japanese Journal of Applied Physics*, 40, (Jan. 2001),285-289.

Kawai, Y, et al., "Ultra-low-temperature growth of high-integrity gate oxide films by low-energy Ion-assisted oxidation", *Applied Physics Letters*, 64(17), (Apr. 1994),2223-2225.

Keomany, D, et al., "Sol gel preparation of mixed cerium-titanium oxide thin films", *Solar Energy Materials and Solar Cells*, 33(4), (Aug. 1994),429-441.

Kim, C T., et al., "Application of Al2O3 Grown by Atomic Layer Deposition to DRAM and FeRam", *International Symposium in Integrated Ferroelectrics*, (Mar. 2000),316.

Kim, C. T., et al., "Application of Al3O3 Grown by Atomic Layer Deposition to DRAM and FeRAM", *12th International Symposium in Integrated Ferroelectrics*, (Mar. 2000),1 page.

Kim, D., et al., "Atomic Control of Substrate Termination and Heteroepitaxial Growth of SrTiO3/LaAlO3 Films", *Journal of the Korean Physical Society*, 36(6), (Jun. 2000),444-448.

Kim, Byoung-Youp, et al., "Comparison strudy for TiN films deposited from different method: chemical vapor deposition and atomic layer deposition", *Mechanisms of Surface and Microstructure Evolution in Deposited Films and Film Structures Symposium (Materials Research Society Symposium Proceedings* vol. 672), (2001),7.8.1-7.8.6.

Kim, Taeseok, et al., "Correlation between strain and dielectric properties in ZrTiO/sub 4/ thin films", *Applied Physics Letter*, 76(21), (May 2000),3043-3045.

Kim, Taeseok, et al., "Dielectric properties and strain analysis in paraelectric ZrTiO/sub 4/ thin films deposited by DC magnetron sputtering", *Japanese Journal of Applied Physics Part 1-Regular Papers Short Notes & Review Papers*, 39(7A), (2000),4153-4157.

Kim, Yongjo, et al., "Effect of microstructures on the microwave dielectric properties of ZrTiO/sub 4/ thin films"*Applied Physics Letters*, 78(16), (Apr. 16, 2001),2363-2365.

Kim, Y, et al., "Substrate dependence on the optical properties of Al/sub 2/O/sub 3/ films grown by atomic layer deposition", *Applied Physics Lettes*, 71(25, 22), (Dec. 1997),3604-3606.

Klaus, J W., et al., "Atomic Layer Controlled Growth of SiO2 Films Using Binary Reaction Sequence Chemistry", *Applied Physics Letters*70(9), (Mar. 3, 1997),1092-94.

Krauter, G., et al., "Room Temperature Silicon Wafer Bonding with Ultra-Thin Polymer Films", *Advanced Materials*, 9(5), (1997), 417-420.

Kukli, Kaupo, "Atomic Layer Deposition of Titanium Oxide from Til4 and H2O2", *Chemical Vapor Deposition*, 6(6), (2000), 303-310.

Kukli, K, et al., "Comparison of hafnium oxide films grown by atomic layer deposition from iodide and chloride precursors", *Thin Solid Films*, 416, (2002), 72-79.

Kukli, K, et al., "Controlled growth of yttrium oxysulphide thin films by atomic layer deposition", *Materials Science Forum*, 315-317, (1999),216-221.

Kukli, Kaupo, et al., "Dielectric Properties of Zirconium Oxide Grown by Atomic Layer Deposition form Iodide Precursor", *Journal of The Electrochemical Society*, 148(12),(2001),F227-F232.

Kukli, Kaupo, et al., "Influence of thickness and growth temperature on the properties of zirconium oxide films growth by atomic layer deposition on silicon", *Thin Solid Films*, 410(1-2), (2002),53-60.

Kukli, Kaupo, et al., "Low-Temperature Deposition of Zirconium Oxide-Based Nanocrystalline Films by Alternate Supply of Zr[OC(CH3)3]4 and H2O", *Chemical Vapor Deposition*, 6(6), (2000),297-302.

Kukli, K J., et al., "Properties of hafnium oxide films grown by atomic layer deposition from hafnium tetraiodide and oxygen", *Journal of Applied Physics*92(10), (Nov. 15, 2002),5698-5703.

Lee, A E., et al., "Epitaxially grown sputtered LaAlO3 films", *Applied Physics Letters*57(19), (Nov. 1990),2019-2021.

Lee, Cheng-Chung, et al., "Ion-assisted deposition of silver thin films", *Thin Solid Films*, 359(1), (Jan. 2000),95-97.

Lee, Dong H., et al., "Metalorganic chemical vapor deposition of TiO2:N anatase thin film on Si substrate", *Appl. Phys. Lett.*, 66(7), (Feb. 1995),815-816.

Lee, L P., et al., "Monolithic 77 K dc SQUID magnetometer", *Applied Physics Letters*, 59(23), (Dec. 1991),3051-3053.

Lee, C. H., et al., "MOS Characteristics of Ultra Thin Rapid Thermal CVD ZrO2 and Zr Silicate Gate Dielectrics", *Electron Devices Meeting, 2000, IEDM Technical Digest. International*, (2000),27-30.

Lee, C H., et al., "MOS Devices with High Quality Ultra Thin CVD ZrO2 Gate Dielectrics and Self-Aligned TaN and TaN/Poly-Si Gate electrodes", *2001 Symposium on VLSI, Technology Digest of Technical Papers*, (2001),137-138.

Lee, Byoung H., et al., "Ultrathin Hafnium Oxide with Low Leakage and Excellent Reliability for Alternative Gate Dielectric Application", *Technical Digest of IEDM*, (1999),133-136.

Leskela, M., et al., "ALD precursor chemistry: Evolution and future challenges", *J. Phys. IV France*, 9, (1999),837-852.

Liu, C. T., "Circuit Requirement and Integration Challenges of Thin Gate Dielectrics for Ultra Small MOSFETs", *International Electron Devices Meeting 1998. Technical Digest*, (1998),747-750.

Liu, Y C., et al., "Growth of ultrathin SiO/sub 2/ on Si by surface irradiation with an O/sub 2/+Ar electron cyclotron resonance microwave plasma at low temperatures", *Journal of Applied Physics*, 85(3), (Feb. 1999),1911-1915.

Lucovsky, G, et al., "Microscopic model for enhanced dielectric constants in low concentration SiO/sub 2/-rich noncrystalline Zr and Hf silicate alloys", *Applied Physics Letters*77(18), (Oct. 2000),2912-2914.

Luo, Z J., et al., "Ultra-thin ZrO2 (or Silicate) with High Thermal Stability for CMOS GAte Applications", *2001 Symposium on VLSI Technology Digest of Technical Papers*, (2001),135-136.

Martin, P J., et al., "Ion-beam-assisted deposition of thin films", *Applied Optics*, 22(1), (Jan. 1983),178-184.

Molodyk, A A., et al., "Volatile Surfactant-Assisted MOCVD: Application to LaAl03 Thin Film Growth", *Chemical Vapor Deposition*, 6(3), (Jun. 2000),133-138.

Molsa, Heini, et al., "Growth of yttrium oxide thin films from beta -diketonate precursor", *Advanced Materials for Optics and Electronics*4(6), (Nov.-Dec. 1994),389-400.

Muller, D. A., "The electronic structure at the atomic scale of ultrathin gate oxides", *Nature*, 399(6738), (Jun. 24, 1999),758-61.

Muller, D. A., "The Electronic Structure at the Atomic Scale of Ultrathin Gate Oxides", *Nature*, 399, (Jun. 1999),758-761.

Nakagawara, Osamu, et al., "Electrical properties of (Zr, Sn)TiO4 dielectric thin film prepared by pulsed laser deposition", *Journal of Applied Physics*, 80(1), (Jul. 1996),388-392.

Nakajima, Anri, et al., "Atomic-layer deposition of ZrO/sub 2/ with a Si nitride barrier layer", *Applied Physics Letters*, 81(15), (Oct. 2002),2824-2826.

Nakajima, Anri, et al., "NH/sub 3/-annealed atomic-layer-deposited silicon nitride as a high-k gate dielectric with high reliability", *Applied Physics Letters*, 80(7), (Feb. 2002),1252-1254.

Neumayer, D A., et al., "Materials characterization of ZrO/sub 2/-SiO/sub 2/ and HfO/sub 2/-SiO/sub 2/ binary oxides deposited by chemical solution deposition", *Journal of Applied Physics*, 90(4), (Aug. 15, 2001),1801-1808.

Nieminen, Minna, et al., "Formation and stability of lanthanum oxide thin films deposited from B-diketonate precursor", *Applied Surface Science*, 174(2), (Apr. 16, 2001),155-165.

Niilisk, A, "Atomic-scale optical monitoring of the initial growth of TiO2 thin films", *Proceedings of the SPIE—The International Society for Optical Engineering*, 4318, (2001),72-77.

Oates, D E., et al., "Surface impedance measurements of YBa/sub 2/Cu/sub 3/O/sub 7-x/ thin films in stripline resonators", *IEEE Transactions on Magnetics*, vol. 27, No. 2, pt. 2, (Mar. 1991),867-871.

Ohring, Milton, "The Materials Science of Thin Films", *Boston : Academic Press*, (1992),118,121,125.

Osten, H. J., et al., "High-k gate dielectrics with ultra-low leakage current based on praseodymium oxide", *International Electron Devices Meeting 2000. Technical Digest. IEDM*, (2000),653-656.

Osten, H J., et al., "High-k Gate Dielectrics with Ultra-low Leakage Current Based on Praseodymium Oxide", *Technical Digest of IEDM*, (2000),653-656.

Ott, A W., et al., "Al3O3 Thin Film Growth on Si(100) Using Binary Reaction Sequence Chemistry", *Thin Solid Films*, vol. 292, (1997),135-44.

Pan, Tung M., et al., "High quality ultrathin CoTiO/sub 3/ high-k gate dielectrics", *Electrochemical and Solid-State Letters*, 3(9), (Sep. 2000),433-434.

Pan, Tung M., et al., "High-k cobalt-titanium oxide dielectrics formed by oxidation of sputtered Co/Ti or Ti/Co films", *Applied Physics Letters*, 78(10), (Mar. 5, 2001),1439-1441.

Park, Byung-Eun, et al., "Electrical properties of LaAlO3/Si and Sr0.8Bi2.2Ta2O9/LaAlO3/Si structures", *Applied Physics Letters*, 79(6), (Aug. 2001),806-808.

Perkins, Charles M., et al., "Electrical and materials properties of ZrO2 gate dielectrics grown by atomic layer chemical vapor deposition", *Applied Physics Letters*, 78(16), (Apr. 2001),2357-2359.

Poveshchenko, V P., et al., "Investigation of the phas composition of films of zirconium, hafnium and yttrium oxides", *Soviet Journal of Optical Technology*, 51(5), (1984),277-279.

Qi, Wen-Jie, et al., "MOSCAP and MOSFET characteristics using Zr02 gate dielectric deposited directly on Si", *Electron Devices Meeting, 1999. IEDM Technical Digest. International*, (1999),145-148.

Qi, Wen-Jie, et al., "Performance of MOSFETs with ultra thin ZrO/sub 2/ and Zr silicate gate dielectrics", *2000 Symposium on VLSI Technology. Digest of Technical Papers*, (2000),40-41.

Rahtu, Antti, et al., "Atomic Layer Deposition of Zirconium Titanium Oxide from Titanium Isopropoxide and Zirconium Chloride", *Chemistry of Materials*, 13(5), (May 2001),1528-1532.

Ramakrishnan, E S., et al., "Dielectric properties of radio frequency magnetron sputter deposited zirconium titanate-based thin films", *Journal of the Electrochemical Society*, 145(1), (Jan. 1998),358-362.

Rayner Jr., G, et al., "The structure of plasma-deposited and annealed pseudo-binary ZrO2-SiO2 alloys", *Materials Research Society Symposium -Proceedings*, 611, (2000),C131-C139.

Ritala, Mikko, "Atomic Layer Epitaxy Growth of Titanium, Zirconium and Hafnium Dioxide Thin Films", *Annales Academiae Scientiarum Fennicae*, (1994),24-25.

Ritala, Mikko, et al., "Zirconium dioxide thin films deposited by ALE using zirconium tetrachloride as precursor", *Applied Surface Science*, 75, (Jan. 1994),333-340.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1791.

Rossnagel, S M., et al., "Plasma-enhanced atomic layer deposition of Ta and Ti for Interconnect diffusion barriers", *Journal of Vacuum Science & Technology B (Microelectronics and Nanometer Structures)*, 18(4), (Jul. 2000),2016-2020.

Rotondaro, A L., et al., "Advanced CMOS Transistors with a Novel HfSiON Gate Dielectric", *Symposium on VLSI Technology Digest of Technical Papers*, (2002),148-149.

Saito, Yuji, et al., "Advantage of Radical Oxidation for Improving Reliability of Ultra-thin Gate Oxide", *2000 Symposium on VLSI Technology Digest of Technical Papers*, (2000),176-177.

Saito, Yuji, et al., "High-Integrity Silicon Oxide Grown at Low-Temperature by Atomic Oxygen Generated in High-Density Krypton Plasma", *Extended Abstracts of the 1999 International Conference on Solid State Devices and Materials*, (1999),152-153.

Semiconductor Industry Associati, "International Technology for Semiconductor Roadmap", http://public.itrs.net/Files/2001ITRS/Links/1999 SIA Roadmap/, (1999).

Shanware, A, et al., "Reliability evaluation of HfSiON gate dielectric film with 12.8 A SiO2 equivalent thickness", *International Electron Devices Meeting. Techincal Digest*, (2001),6.6.1-6.6.4.

Shin, Chang H., et al., "Fabriation and Characterization of MFISFET using Al2O3 Insulating Layer for Non-Volatile Memory", *12th International Symposium in Integrated Ferroelectrics*, (Mar. 2000),1-9.

Sneh, Ofer, et al., "Thin film atomic layer deposition equipment for semiconductor processing", *Thin Solid Films*, 402(1-2), (Jan. 1, 2002),248-261.

Sneh, Ofer, "Thin film atomic layer deposition equipment for semiconductor processing", *Thin Solid Films,*, 402(1-2), (Jan. 2002),248-261.

Song, Hyun-Jung, et al., "Atomic Layer Deposition of Ta2O5 Films Using Ta(OC2H5)5 and NH3", *Ultrathin SiO/sub 2/ and High-K Materials for ULSI Gate Dielectrics. Symposium*, (1999),469-471.

Suntola, T., "Atomic Layer Epitaxy", *Handbook of Crystal Growth, 3; Thin Films of Epitaxy, Part B: Growth Mechanics and Dynamics*, Amsterdam,(1994),602-663.

Suntola, T, "Atomic layer epitaxy", *Thin Solid Films*, 216(1), (Aug. 28, 1992),84-89.

Sze, S M., "Physics of Semiconductor Devices", *New York : Wiley*, (1981),431.

Sze, S M., "Physics of Semiconductor Devices", *New York : Wiley*, (1981),473.

Takemoto, J. H., et al., "Microstrip Resonators and Filters Using High-TC Superconducting Thin Films on LaAlO3", *IEEE Transaction on Magnetics*, 27(2), (Mar. 1991),2549-2552.

Tarre, A, et al., "Comparative study of low-temperature chloride atomic-layer chemical vapor deposition of TiO2 and SnO2", *Applied Surface Science*, 175-176, (May 2001),111-116.

Van Dover, R. B., et al., "Amorphous lanthanide-doped TiOx dielectric films", *Applied Physics Letters*, 74(20), (May 17, 1999),3041-3043.

Van Dover, Robert B., et al., "Deposition of Uniform Zr-Sn-Ti-O films by ON-Axis Reactive Sputtering", *IEEE Electron Device Letters*, 19(9), (Sep. 1998),329-331.

Van Dover, R. B., et al. "Discovery of a useful thin-film dielectric using a composition-spread approach", *Nature*, 392, (Mar. 12, 1998),162-164.

Viirola, H, "Controlled growth of antimony-doped tin dioxide thin films by atomic layer epitaxy", *Thin Solid Films*, 251, (Nov. 1994),127-135.

Viirola, H, "Controlled growth of tin oxide thin films by atomic layer epitaxy", *Thin Solid Films*, 249(2), (Sep. 1994),144-149.

Visokay, M R., "Application of HfSiON as a gate dielectric material", *Applied Physics Letters*, 80(17), (Apr. 2002),3183-3185.

Wang, P. W., et al., "Excellent Emission Characteristics of Tunneling Oxides Formed Using Ultrathin Silicon Films for Flash Memory Devices", *Japanese Journal of Applied Physics*, 35, (Jun. 1996),3369-3373.

Wilk, G D., et al., "Hafnium and zirconium silicates for advanced gate dielectrics", *Journal of Applied Physics*, 87(1), (Jan. 2000),484-492.

Wilk, G. D., et al., "High-K gate dielectrics: Current status and materials properties considerations", *Journal of Applied Physics*, 89(10), (May 2001),5243-5275.

Wolf, Stanley, et al., "Silicon Processing for the VLSI Era—vol. I: Process Technology", *Second Edition, Lattice Press*, Sunset Beach, California,(2000),443.

Wolfram, G, et al., "Existence range, structural and dielectric properties of $Zr_xTi_ySn_zO_4$ ceramics (x+y=2)", *Materials Research Bulletin*, 16(11), (Nov. 1981),1455-63.

Yamaguchi, Takeshi, "Band Diagram and Carrier Conduction Mechanism in ZrO2/Zr-silicate/Si MIS Structure Fabricated by Pulsed-laser-ablation Deposition", *Electron Devices Meeting, 2000. IEDM Technical Digest. International*, (2000),19-22.

Yamaguchi, Takeshi, et al., "Study on Zr-Silicate Interfacial Layer of ZrO2-MIS Structure FAbricated by Pulsed Laser Ablation Deposition Method", *Solid State Devices and Materials*, (2000),228-229.

Zhang, H., "Atomic Layer Deposition of High Dielectric Constant Nanolaminates", *Journal of The Electrochemical Society*148(4), (Apr. 2001),F63-F66.

Zhang, H, et al., "High permittivity thin film nanolaminates", *Journal of Applied Physics*, 87(4), (Feb. 2000),1921-1924.

Zhu, W, et al., "HfO2 and HfAlO for CMOS: Thermal Stability and Current Tranport", *IEEE International Electron Device Meeting 2001*, (2001),463-466.

Zucker, O, et al., "Application of Oxygen Plasma Processing to Silicon Direct Bonding", *Sensors and Actuators A*, 36, (1993),227-231.

\* cited by examiner

ENHANCED ATOMIC LAYER DEPOSITION

RELATED APPLICATIONS

This application is a Divisional of U.S. application Ser. No. 10/229,338, filed Aug. 26, 2002, now U.S. Pat. No. 6,967,154, which is incorporated herein by reference.

The present application is generally related to U.S. application Ser. No. 10/137,058, titled ATOMIC LAYER DEPOSITION AND CONVERSION, filed May 2, 2002.

The present application is generally related to U.S. application Ser. No. 09/782,207, titled SEQUENTIAL PULSE DEPOSITION, filed Feb. 13, 2001, now U.S. Pat. No. 6,613,656.

All of the above listed applications are hereby incorporated by reference for any purpose.

FIELD OF THE INVENTION

The present invention relates to deposition techniques and, more particularly, to enhanced atomic layer deposition techniques for forming layers on wafers or substrates and to resulting structures and devices for performing the atomic layer techniques.

BACKGROUND

Integrated circuit devices continue to be reduced in size in order to create smaller devices that consume less power and operate faster. However, the reduction in size has increased the need for more precise layers that form the integrated circuits. More precise layers require excellent step coverage to prevent unwanted shorts between layers in an integrated circuit. That is, the stoichiometry of the layers must continue to be improved. Moreover, the purity of the layers becomes more important on the smaller scale integrated circuits as a single impurity may cause a layer to fail or short two adjacent layers.

As an example, modem integrated circuit design has advanced to the point where line width may be 0.25 microns or less. As a result, repeatability and uniformity of processes and their results is becoming increasingly important. Generally, it is desired to have thin films deposited on the wafer to save space. Yet reducing the thickness of films can result in pinholes and reduced mechanical strength, both of which may lead to shorts through the film.

Another development in the field of thin film technology for coating substrates is atomic layer deposition (ALD). A description of ALD is set forth in U.S. Pat. No. 5,879,459, which is herein incorporated by reference in its entirety. ALD operates by confining a wafer in a reaction chamber at a typical temperature of less than 300 degrees Celsius. Precursor gas is pulsed into the chamber, wherein the pulsed precursor forms a monolayer on the substrate by chemisorption. The low temperature limits the bonding of the precursor to chemisorption, thus only a single layer, usually only one atom or molecule thick, is grown on the wafer. Each pulse is separated by a purge pulse which completely purges all of the precursor gas from the chamber before the next pulse of precursor gas begins. Each injection of precursor gas provides a new single atomic layer on the previously deposited layers to form a layer of film. Obviously, this significantly increases the time it takes to deposit a layer having adequate thickness on the substrate.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

SUMMARY

The present invention includes methods for forming a layer in an integrated circuit using enhanced atomic layer deposition as described herein and structures resulting from the methods. A method includes providing energy to disassociate components of a precursor gas to further enhance atomic layer deposition ("ALD"). In an embodiment, a plasma disassociates components of a precursor gas. In an embodiment, a thermal energy disassociates components of a precursor gas. The disassociated component reacts with another precursor gas to form an ALD layer in the integrated circuit.

In an embodiment, the present method includes purging a first gas and starting a plasma during the purging the first gas. In an embodiment, the method further includes flowing the first gas as a first precursor to the ALD reaction. A portion of the first gas remains adjacent the substrate. The method further includes flowing a second gas as a second precursor to the ALD reaction. The method further includes reacting the first and second gases according to ALD principles to form a layer on a substrate. In an embodiment, the plasma is maintained during a portion of the flowing of the second gas. In an embodiment, the plasma disassociates a component of the second gas. In an embodiment, the plasma is formed by applying about 300 Watts of RF power. The component reacts with the first gas to form the ALD layer. In an embodiment, the plasma ends prior to ending the flow of the second gas. In an embodiment, the process repeats the cycle of flowing a first gas, flowing a second gas, disassociating, and reacting to form multiple sub-layers. In an embodiment, the first precursor gas includes $TaF_5$. In an embodiment, the second precursor gas includes $NH_3$. In an embodiment the layer is TaN.

In an embodiment, the present method includes heating one of the reaction chamber and the substrate to a temperature of about 400 degrees Celsius. In an embodiment, the present method includes heating one of the reaction chamber and the substrate to a temperature above about 350 degrees Celsius. The precursor gases then sequentially flow into the chamber according to ALD principles and react at the substrate to form the layer of the present invention. The thermal energy disassociates a component of at least one of the precursor gases to enhance the ALD reaction. In an embodiment, a first precursor gas of $TaF_5$ flows into the reaction chamber. A portion of the $TaF_5$ gas remains at the surface of the substrate. In an embodiment, a second precursor gas including at least one of $SiH_4$ and $NH_3$ flows into the chamber. In an embodiment, a layer of TaN is formed.

In an embodiment, the ALD layer of the present invention is a metal layer. In an embodiment, the metal layer includes tantalum. In an embodiment, the ALD layer is TaN. The ALD layer is adapted to be used as a barrier layer in an integrated circuit device. Integrated circuit devices include memory cells, capacitors, and transistors. The integrated circuit devices are adapted to be used in memory devices, memory systems, computing systems and electronic devices. In an embodiment, the ALD layer of the present invention is in a substrate, wafer, or die. In an embodiment, the TaN layer has a ratio of Ta:N of about 1:1. In an embodiment, the TaN layer has a resistivity of about 2500 µOhms-cm. In an embodiment, the TaN layer has a resistivity of about 2000 µOhms-cm.

DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, fabrication of films on substrates, devices and systems for such fabrication, media containing instructions therefor, and integrated circuit devices produced according to the present invention are described.

Figure 1:
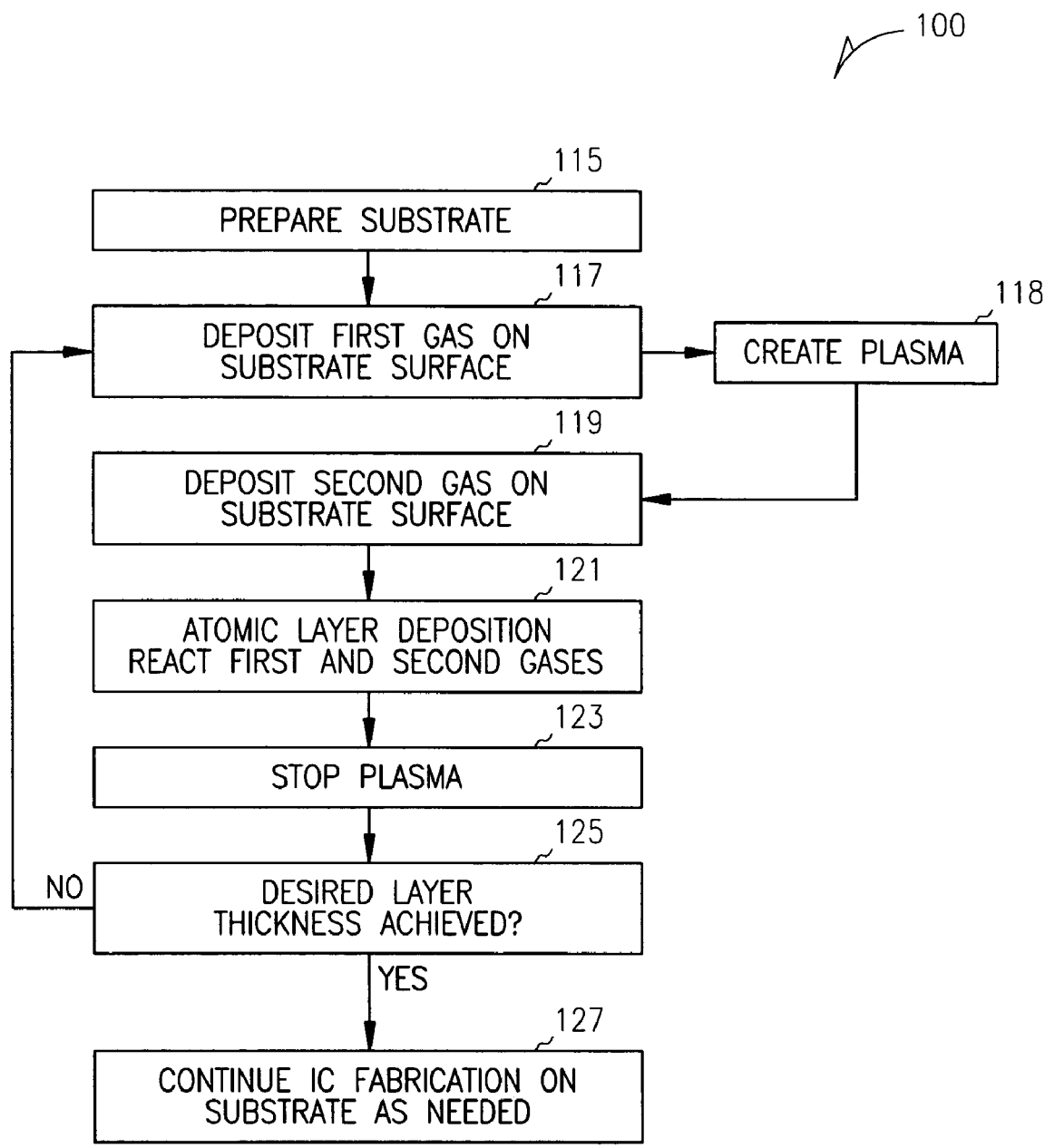
FIG. 1 is a flow diagram according to an embodiment of the present invention.

FIG. 1 depicts a method for forming a layer using atomic layer deposition 100 according to an embodiment of the present invention. A substrate is prepared, 115, to have a layer, such as a thin film, formed on the fabrication surface of the substrate. The substrate preparation includes forming integrated circuit structures on the substrate. Such structures include trenches, insulating layers, field oxides, capacitor layers, and transistor component structures. Thus, the surface of the substrate on which a layer is formed according to the present invention is, in an embodiment, not planar. That is, the layer to be deposited must conform to the topology of the substrate surface. The substrate, in an embodiment, includes both logic circuits and memory devices. A first precursor gas deposits a first compound on the substrate surface, 117. In an embodiment, the first compound includes a metal. In an embodiment, the first compound includes a refractory metal. In an embodiment, the first compound includes tantalum. In an embodiment, the first compound includes $TaF_5$. According to atomic layer deposition principles a very small amount (very thin layer) of the first precursor compound adheres to the substrate surface. A plasma is initiated adjacent the substrate, 118. In an embodiment, the plasma is initiated in the reaction chamber that holds the substrate. A second precursor gas provides a second compound adjacent the substrate surface, 119, and, hence, the first compound. In an embodiment, the second compound includes nitrogen. In an embodiment, the second compound includes ammonia. The second compound reacts with the first compound at the substrate surface to deposit a layer according to ALD principles, 121. The deposited layer includes an element from each of the first and second compounds. In an embodiment, the deposited layer includes a metal and another element. In an embodiment, the deposited layer includes tantalum. In an embodiment, the deposited layer includes TaN. The plasma stops in step 123. In an embodiment, the plasma creation stops during the reaction of the first and second compounds. In an embodiment, the plasma creation stops when the flow of the second gas stops. The deposited layer is typically deposited in a thickness of less than a few atomic layers. In an embodiment, the thickness of the layer is about 100 angstroms. In an embodiment, the thickness of the layer is deposited at about 1 angstroms per cycle. In an embodiment, the thickness of the layer is deposited at less than about 1 angstroms per cycle. Accordingly, the method determines if the deposited layer has the desired thickness, 125. The method of the present invention may directly measure the thickness of the deposited layer in an embodiment. In an embodiment, the method of the present invention may rely on prior test data to determine how many times the cycle of steps must be repeated to achieve the desired deposited layer thickness. If the deposited layer does not have the desired thickness the method returns to step 117. In an embodiment, the desired thickness is about 300 angstroms. The layer deposited according to the present invention is deposited at a rate of about 1 angstroms per cycle. Thus, the cycle repeats three hundred times to deposit a 300 angstrom layer. If the deposited layer has the desired thickness, then the method proceeds to further IC fabrication on the substrate, 127.

In an example of process 100, a TaN film is formed. A purge gas evacuates the air from the reaction chamber that encloses at least one substrate. A first precursor gas, which includes tantalum (Ta), is pulsed into the reaction chamber for two seconds. In an embodiment, the first precursor gas includes $TaF_5$. An amount of the Ta in the precursor gas adheres to the surface of the substrate according to ALD principles. An inert purge gas, e.g., argon, is pulsed into the chamber for four seconds to exhaust the first precursor gas except for the portion that adheres to the substrate surface. During the purge gas pulse, a plasma energy is delivered to the reaction chamber. The purge gas forms a plasma as it exhausts the precursor gas. The plasma energy is about 300 Watts. After the first precursor gas is purged, the second precursor gas, which includes nitrogen (N), is pulsed into the reaction chamber for two seconds. In an embodiment, the second precursor gas include $NH_3$. The plasma energy continues to form a plasma out of the second precursor gas. The portion of the first precursor gas that is at the substrate surface reacts with the second precursor gas to form an ALD TaN layer on the substrate. The plasma energy is turned off. The second precursor pulse ends. If the TaN layer has the desired thickness, then the process ends. If the TaN layer does not have the desired thickness, then the process repeats.

Figure 2:
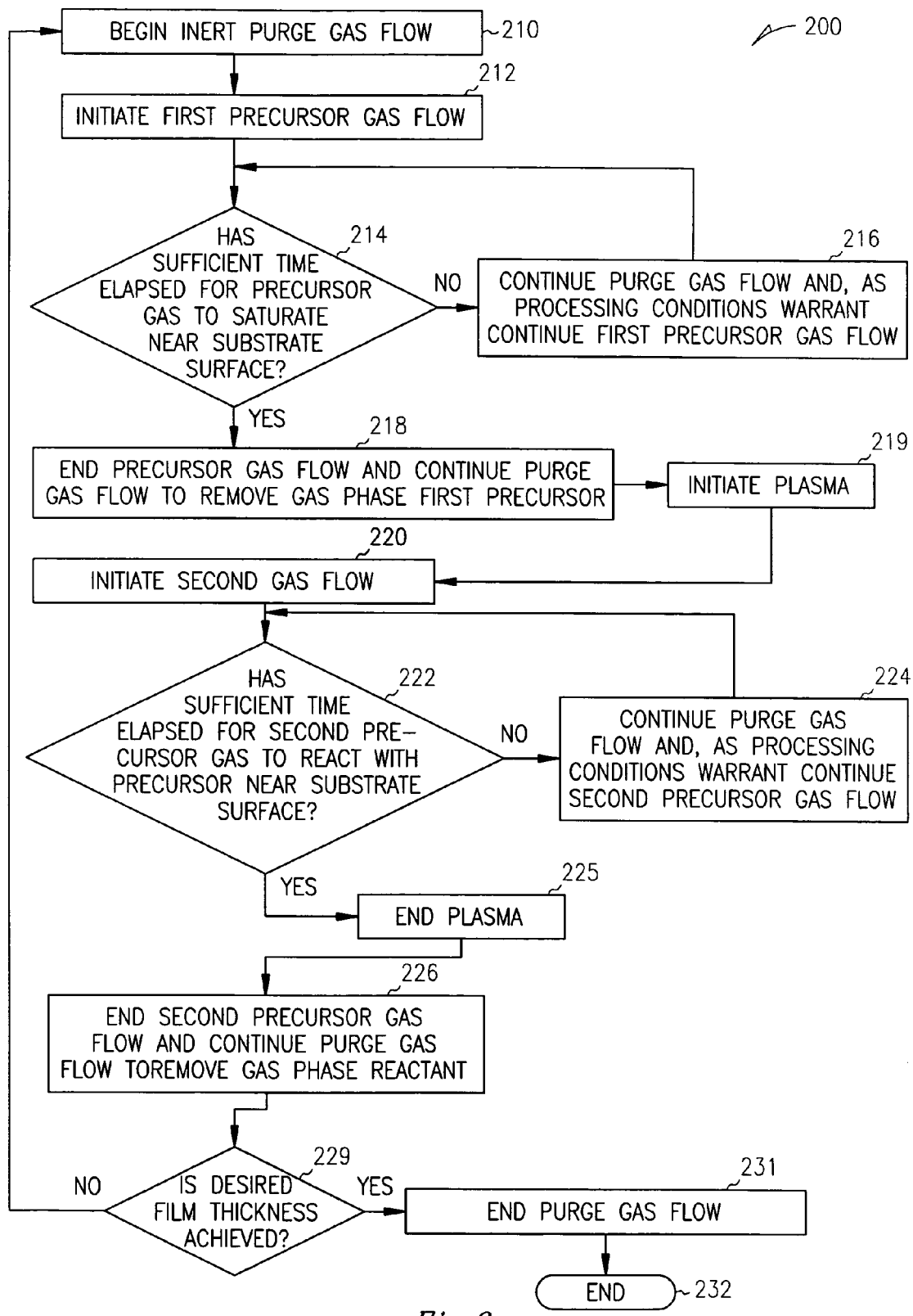
FIG. 2 is a flow diagram according to an embodiment of the present invention.

FIG. 2 depicts a process 200 according to the teachings of the present invention. Process 200 begins by initiating an inert purge gas flow through a reactor, 210. The purge gas maintains the reactor chamber at a generally constant pressure. The purge gas is selected to be inert in the chemical reaction between the first and second precursor gases. In an embodiment of the present invention the purge gas flow is pulsed, for example only injecting purge gas between other gas pulses. In another embodiment, purge gas is not used at all, i.e. step 210 is not performed.

The first precursor gas containing a first element to be deposited on the substrate now flows into the reaction chamber, 212. In an embodiment, the first element is conductive. In an embodiment, the conductive first element is a metal. In an embodiment, the metal includes, for example, tantalum. The metals can also include alloys that include tantalum. The metal, in an embodiment, is one element of a compound. The first precursor gas flow continues until a volume closely adjacent the surface of the substrate on which the first element will be deposited is saturated by the first precursor gas, 214. According to the teachings of the present invention, the first precursor gas saturates the topology of the substrate so that adequate precursor material is adjacent the substrate surface by the first precursor gas entering and/or coating the steps, trenches, and holes. The first precursor gas flow, as well as purge gas flow, if present, continues until the required saturation occurs depending on the processing conditions dictated by the type of substrate and precursor gas, and the topology of the substrate, 216. A substrate having numerous or high aspect steps may require a longer first precursor gas flow period than a substrate which has few steps or relative low aspect steps.

The first precursor gas flow ends once the first precursor gas saturates adjacent the substrate according to the processing conditions of the present deposition, 218. After the first precursor gas flow is stopped, energy to create a plasma in the reaction chamber begins, 219. The energy forms a plasma out of the gas remaining in the reaction chamber. In an embodiment, the purge gas begins forming the plasma. After the energy for forming the plasma is turned on, a second precursor gas flows in the reaction chamber, 220. The second precursor gas continues to flow into the reaction chamber until the second precursor gas saturates the volume adjacent the surface of the substrate on which the substance in the first precursor gas has been deposited, 222. The second precursor gas includes an element that will combine with the first precursor gas that remains adjacent the substrate surface. The plasma energy disassociates the elements of the second precursor. Accordingly, a disassociated element from the second precursor gas is free to form the desired ALD deposited layer with an element of the first precursor gas. The first precursor gas and the disassociated element of second precursor gas chemically react and deposit the desired compound in a ALD layer, e.g., monolayer, on the substrate. In an embodiment, the deposited monolayer is about one atomic layer thick. In an embodiment, the deposited ALD layer is less than one atomic layer thick. The monolayer and the ALD layer are an essentially pure layer of a single compound. In an embodiment, the disassociated element from the second precursor is N. In an embodiment, the layer formed by the present process is TaN.

The present process may continue the purge gas flow while the second precursor gas flows into the reaction chamber, 224. Once a sufficient quantity of second precursor gas is present to complete the reaction with the first precursor gas to deposit a layer on the substrate, the second precursor gas flow ends, 226. Purge gas flow may continue to at least partially flush the residual reaction and precursor gases and the by-product gas of the first and second precursors and reactant reaction from the reaction chamber.

At step 229, it is determined if the ALD layer formed by the previous steps has the desired layer thickness. If the layer now formed by one or a plurality of the ALD step iterations of the present invention has the desired thickness, then the ALD process proceeds to process end steps. If purge gas is still flowing, then the purge gas flow ends (231) usually after the remnants of the precursor, reactant, and by-product gases are purged from the chamber. The process of the present invention terminates at box 232. The reader should note that process termination comprises initiation of further processing and does not necessarily require shutdown of the reactor, e.g. the above sequence of steps can be repeated or additional fabrication steps are performed. While one embodiment of the invention includes all of the above steps, the present invention includes other embodiments which do not include all of the above steps.

If the layer now formed by the one or plurality of ALD step iterations does not have the desired thickness, then the process returns to step 210 or step 212 and begins another cycle. The process then completes the above sequence/process until step 229 determines that the converted layer has the desired thickness and thus the method proceeds to its end steps 231, 232.

Figure 3:
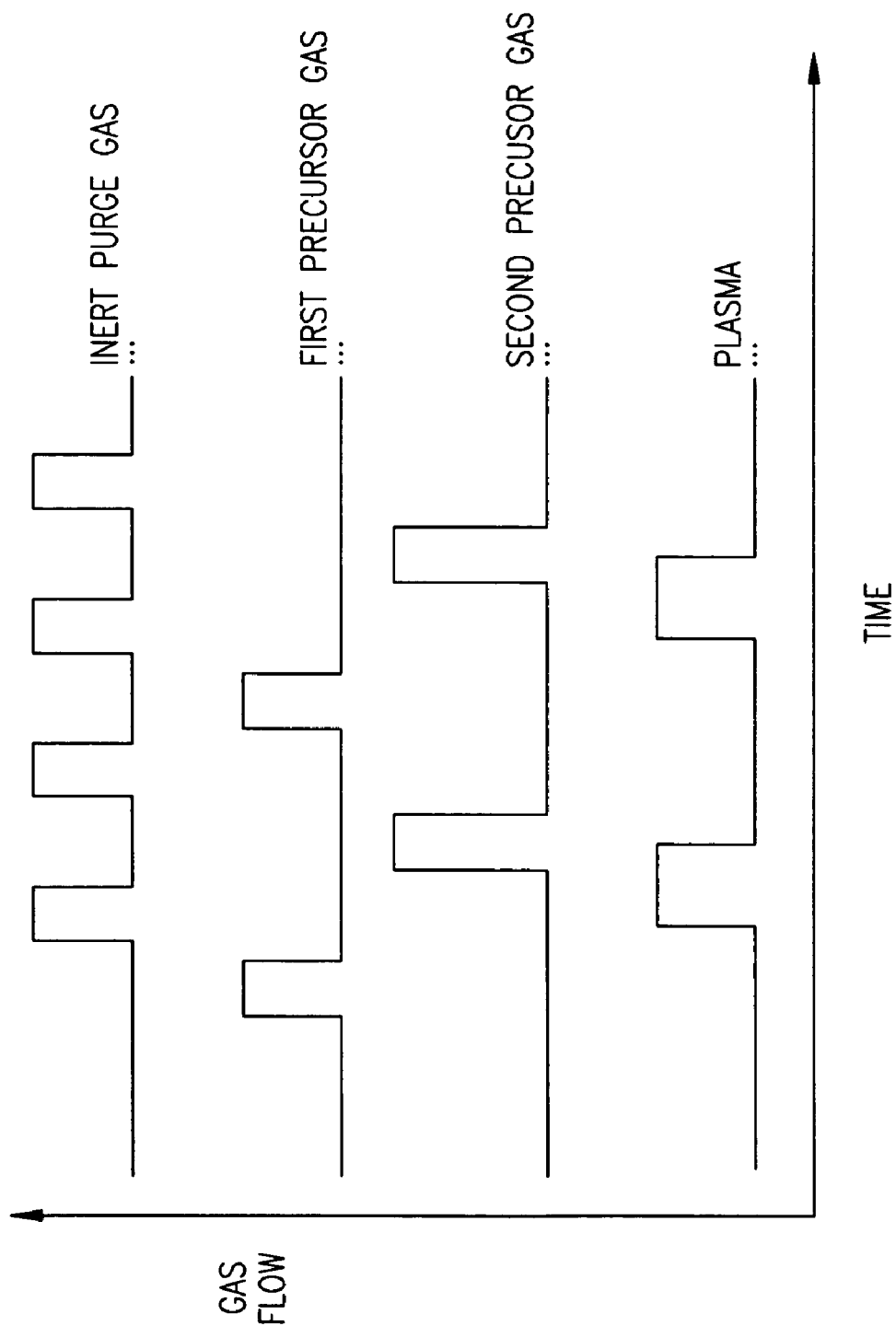
FIG. 3 is a timing diagram according to an embodiment of the present invention.

An embodiment of the present inventive process is shown in FIG. 3. The process begins with flowing a pulse of the first precursor gas containing the first element into the reaction chamber. The first precursor gas flows into the chamber until a sufficient quantity of the element that will form the monolayer is adjacent the substrate as determined by stoichiometry and the particular reaction needed to deposit the desired film on the substrate. The first precursor gas must include a certain minimum amount of the first element to be deposited on a substrate and other reactive components that assist in the depositing the first element on the substrate. In an embodiment, the first element includes tantalum. The precursor gas may flow into the reactor in a quantity greater than determined by the stoichiometry of the reaction. The first precursor gas pulse is in the range of about one to two seconds. A pulse of purge gas now flows into the reaction chamber. The purge gas removes the first precursor gas from the reaction chamber except for a portion of the first precursor gas that remains at the substrate surface according to ALD principles. The purge gas is selected so that it is essentially inert with respect to both the first precursor gas and a second precursor gas. In an embodiment, the purge gas includes argon. The purge gas pulse is in the range of about one to four seconds. While the purge gas pulse is flowing into the reaction chamber, the energy required to form a plasma is turned on. Thus, the purge gas begins forming a plasma in the reaction chamber. A pulse of the second precursor gas flows into the chamber until a sufficient quantity of the second element that will form part of the desired layer on the substrate surface is adjacent the substrate surface. Thus, the second precursor gas is available to react with the first precursor at the surface of the substrate to deposit the desired film. In an embodiment, the second precursor gas pulse is about one to two seconds. The plasma energy continues to be applied to the gases in the reaction chamber during at least part of the pulse of the second precursor. Thus, the energy forms a plasma of the elements of the second precursor gas. The plasma energy disassociates the second element from the other components of the second precursor gas. The second element reacts with the first element to form a layer containing the first and second elements on the substrate surface. In an embodiment, the second element includes nitrogen. In an embodiment, the resulting layer is a metal nitride. In an embodiment, the layer is tantalum nitride. While the ALD reaction is nearing its conclusion, the plasma energy pulse ends. The second precursor gas pulse ends. A further purge gas pulse removes the remaining gases from the chamber and the substrate surface. The process is repeated until the layer formed according to the above steps has the desired thickness.

The amounts of the first precursor gas and the second precursor gas meets or exceeds the amount of material required by the stoichiometry of the particular reaction. That is, the amount of the first and second precursors in certain embodiments, provides excess mass in the reactor. The excess mass is provided to ensure an adequate reaction at the surface of the wafer. In this embodiment, the ratio of first precursor and the second precursor components in the gas phase is different than the stoichiometry of the film.

An example of a TaN layer formed according to plasma enhanced ALD was formed on a wafer. The plasma energy for this example was 300 Watts. The TaN layer has an average resistance of about 1300 µOhms-cm as determined by Creative Design Engineering's resistivity mapping system. In an embodiment, the average resistance is about 2,000 µOhms-cm. Further, a film deposited according to the present invention using $TaF_5$ as a first precursor and NH3 as the second precursor results in less than 10% fluorine in the TaN layer. A film deposited according to the present invention using $TaF_5$ as a first precursor and NH3 as the second precursor results in less than 5% fluorine in the TaN layer. In an embodiment, the fluorine contaminant in the TaN layer is less than about 10%. In an embodiment, the fluorine contaminant in the TaN layer is less than about 5%. Further, the ratio of Ta to N is about 1:1.

Another example of a layer that is formed according to the present invention is a tantalum nitride (TaN) layer formed on a copper layer. The TaN is formed according to the teachings herein on a copper layer in an integrated circuit structure. An example of a copper structure is a signal line. In an embodiment, the copper structure is a trench capacitor. The copper layer lines the capacitor and the TaN is formed directly adjacent the Cu layer. In an embodiment, the copper layer is a hemispherical grain ("HSG") sidewall of an IC capacitor. The TaN layer provides excellent coverage of the HSG layer. The TaN reacts with the Cu layer to form copper tantalum nitride.

Figure 4:
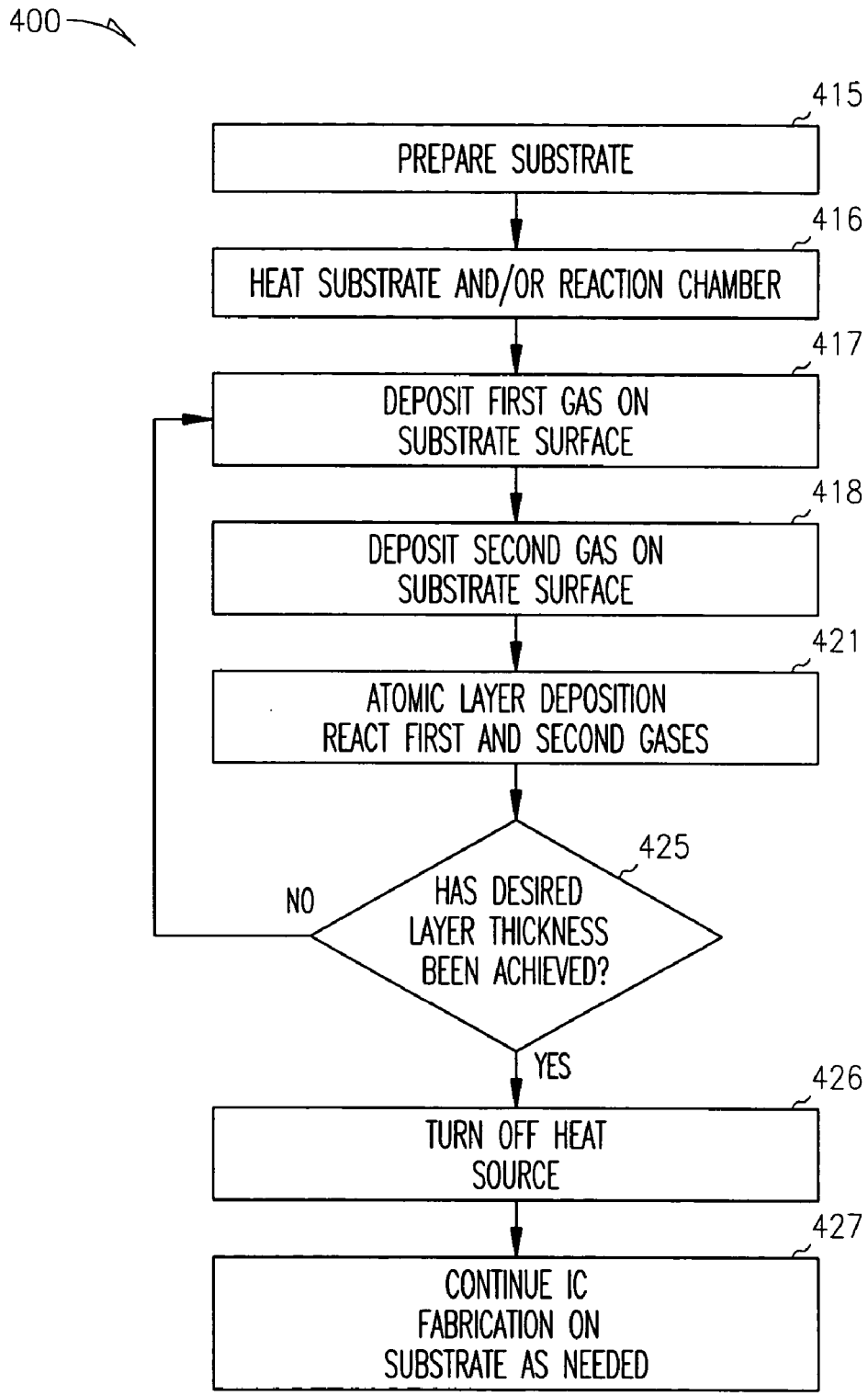
FIG. 4 is a flow diagram according to an embodiment of the present invention.

FIG. 4 shows a process 400 according to an embodiment of the present invention. An integrated circuit substrate is prepared according to fabrication techniques, 415. The techniques include wafer fabrication, thin or thick film fabrication, fabrication of integrated circuit device such as capacitors, transistors, interconnects, etc. as performed in the art. The substrate, in an embodiment, includes both or at least one of logic circuits and memory devices. The substrate is positioned in a deposition chamber. The substrate is heated in the reaction chamber to a desired temperature, 416. In an embodiment, the temperature is about 400 degrees Celsius. In an embodiment, the temperature is 400 degrees Celsius. In an embodiment, the temperature is in the range of about 350 degrees Celsius to about 450 degrees Celsius. The first precursor gas flows into the chamber, 417. In an embodiment, the first precursor gas includes $TaF_5$. In an embodiment, the first precursor gas is $TaF_5$. The first gas adheres to the substrate according to atomic layer deposition (ALD) principles. The first precursor gas not closely adjacent the substrate surface is purged from the chamber. In an embodiment, a purge gas pulse removes the portion of first precursor gas that is not adjacent the substrate from the chamber. In an embodiment, the purge gas is an inert gas. In an embodiment, the purge gas includes argon. In an embodiment, the purge gas is non-reactive with the first precursor gas and a second precursor gases A second precursor gas flows into the chamber. In an embodiment, the second precursor gas includes ammonia ($NH_3$). In an embodiment, the second precursor gas includes ammonia and silane ($SiH_4$). A portion of the second precursor gas flows adjacent the substrate surface, 418. The first precursor gas and the second precursor gas react at the surface of the substrate to form a thin, atomic layer on the substrate surface according to ALD. The reaction deposited a layer of less than 1 angstrom on the substrate. In an embodiment, the deposited layer has a thickness of a few atomic layers. Thus, the reaction is repeated to achieve the thickness. In an embodiment, the deposited layer has a thickness of about 100 angstroms. Accordingly, the reaction is repeated about 100 times. In an embodiment, the reaction is repeated more than 100 times. If the thus formed thin atomic layer has a desired thickness, then the heat source is turned off, 426. The substrate remains heated during the first precursor gas flow, second precursor gas flow, and the reaction of the first and second precursor gas reaction. Thus, the heat supplies energy to the ALD reaction. The substrate with the enhanced ALD deposited layer then continues integrated circuit fabrication, 427.

If the ALD deposited layer does not have the desired thickness, 425, then the process returns to the prior steps 417, 418, 421 to complete another ALD cycle. This will deposit another sub-layer on the previous layer until the ALD deposited layer/sub-layers have the desired thickness. The desired thickness is predetermined by the stoichiometry and purpose of the layer in the integrated circuit.

In an example of the process 400, a TaN film is fabricated. The TaN film is used as a conductive, barrier layer in a variety of IC devices. The substrate is prepared and positioned in a reaction chamber. The substrate is heated to a temperature of about 400 degrees Celsius. A first precursor gas of $TaF_5$ flows into the chamber. In an embodiment, the $TaF_5$ flows into the chamber for about one to three seconds. A portion of the $TaF_5$ gas adheres to the substrate surface. The ambient portion of the first precursor gas that remains in the chamber is purged. A purge pulse of inert gas, e.g., argon, flows into the chamber for about three seconds. A second precursor gas of $SiH_4$ and $NH_3$ flows into the chamber. In an embodiment, the second precursor gas flows into the chamber for about four seconds. The $TaF_5$ and $SiH_4/NH_3$ gases react at the substrate surface to form a TaN film at a rate of about 1.3 angstroms per cycle. The ALD reaction by-product gases are purged from the reaction chamber by a purge gas pulse. The purge gas pulse is another three second pulse of an inert gas, e.g., argon. The by-product gases of this example include $SiF_4$ and $SiHF_3$. The cycle is repeated until the TaN film has the predetermined thickness. The TaN film has a Ta:N ratio of about 1:1. That is, there is essentially no unreacted compounds, impurities or reaction byproducts in the TaN film. The addition of the heat to the reaction assists in disassociating the precursor gas compounds. The TaN film does not have significant amounts of Si or F as these two elements tend to strongly bond and not as strongly bond to Ta or N. That is, the silane effectively captures the fluorine released from the $TaF_5$ gas. In an embodiment, Si impurities in the TaN film are less than 5%. In an embodiment, Si impurities in the TaN film are less than 3%. In an embodiment, Si impurities in the TaN film are in a range of about 2% to about 3%. It can be expected that Si is found in the TaN film in the quantity of one to two percent. This will not adversely effect the performance of the Ta N film in a significant way. The TaN film has a resistivity of about 2500 μohms-cm. In an embodiment, the TaN film has a resistivity in the range of 2250 μohms-cm to 2750 μohms-cm.

Figure 5:
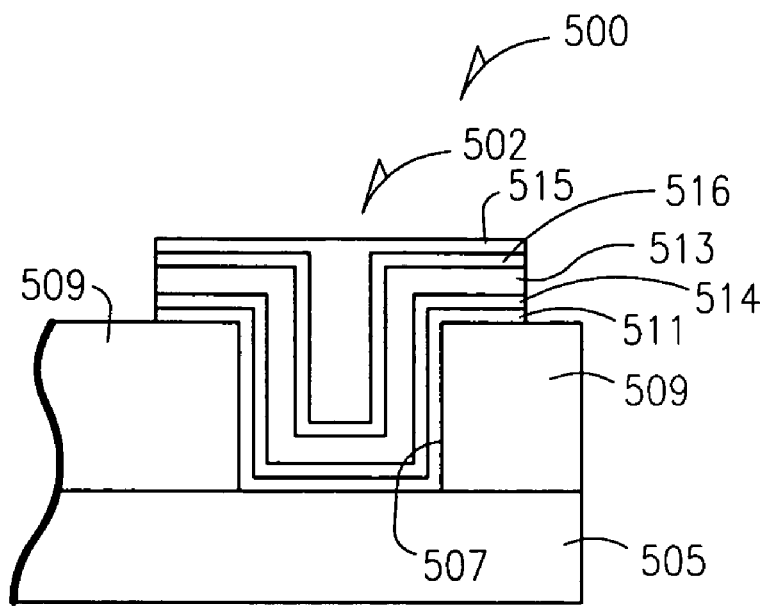
FIG. 5 is an integrated circuit capacitor according to the present invention.

FIG. 5 shows a memory cell 500 including a layer according to the present invention. Memory cell 500 includes a capacitor 502 that is formed on a substrate 505. In an embodiment, the capacitor is a trench capacitor formed in a trench 507 bound by thick insulator layer 509. The thick insulating layer 509 is deposited overlying substrate 505 and any active areas (not shown). Insulating layer 509 is an insulator material such as silicon oxide, silicon nitride and silicon oxynitride materials. For one embodiment, insulating layer 509 is a doped insulator material such as borophosphosilicate glass (BPSG), a boron and phosphorous-doped silicon oxide. The insulating layer 509 is planarized, such as by chemical-mechanical planarization (CMP), in order to provide a uniform height. A mask (not shown) is formed overlying insulating layer 509 and patterned to define future locations of the memory cells 500. Portions of insulating layer 509 exposed by patterned mask are removed. Subsequently, the mask is subsequently removed. The portions of insulating layer 509 may be removed by etching or other suitable removal technique known in the art. Removal techniques are generally dependent upon the material of construction of the layer to be removed as well as the surrounding layers to be retained. Patterning of insulating layer 509 creates openings or trenches 507 having bottom portions overlying exposed portions of the substrate 505 and sidewalls defined by the insulating layer 509. In an embodiment, the sidewalls have a hemispherical grain ("HSG") surface. As known in the art, a contact layer (not shown) is formed at the bottom of the trench 507 in an embodiment. The contact layer connects the memory cell 500 to an access transistor (not shown).

A bottom electrode 511 is formed overlying the trench 507 and insulating layer 509. Bottom electrode 511 is a conductive material. For one embodiment, bottom electrode 511 contains a metal. For another embodiment, the metal component of the bottom electrode 511 is a refractory metal. Bottom electrode 511, in an embodiment, contains more than one conductive layer, e.g., a first metal layer overlying a metal silicide layer. For additional embodiments, the conductive material of bottom electrode 511 contains a metal or conductive metal oxides, including platinum (Pt), titanium (Ti), ruthenium (Ru) or ruthenium oxide ($RuO_x$). Bottom electrode 511 is formed by any of a plurality of methods, such as collimated sputtering, chemical vapor deposition (CVD) or other deposition techniques. Bottom electrode 511 forms the bottom conductive layer or electrode of the capacitor 502. For one embodiment, the bottom conductive layer has a closed bottom and sidewalls extending up from the closed bottom as shown in FIG. 5. For another embodiment, the bottom conductive layer has a substantially planar surface as in a parallel plate capacitor. In an embodiment, the bottom electrode 511 has a roughened or non-smooth surface. In an embodiment, the bottom electrode 511 has a hemispherical grain surface.

The bottom electrode 511, in an embodiment, is formed over a barrier layer that is on the conductive line. In an embodiment, the barrier layer include TaN. In an embodiment, the conductive line is a conductive polysilicon. Thus, this barrier layer is under the bottom electrode.

A first barrier layer 514 is formed overlying the bottom electrode 511 according to the teachings of the present invention. The first barrier layer 514 is shown to be directly adjoining the bottom electrode 511, but there is no prohibition to forming additional conductive layers interposed between the first barrier layer 514 and the bottom electrode 511 described above. The first barrier layer 514 is a conductive layer formed according to the enhanced ALD processes described herein. In an embodiment, the first barrier layer 514 includes a metal nitride material. In an embodiment, the first barrier layer 514 includes a refractory metal nitride material. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. For one embodiment, first barrier layer 511 contains a tantalum nitride material (TaN). The metal nitride act as a diffusion barrier to protect the underlying electrode layer 511 from subsequent oxygen ambient or metal oxide dielectrics. In an embodiment, the metal component of the metal nitride barrier layer 514 is selected to be the same as the metal component of adjacent electrode layer 511. In an embodiment, the barrier layer 514 formed according to the present invention effectively coats the hemispherical grain bottom electrode layer 511.

A dielectric layer 513 is formed overlying the first barrier layer 514. The dielectric layer 514 is shown to be adjoining the first barrier layer 511, but there is no prohibition to forming additional layers interposed between the dielectric layer 513 and the first barrier layer 514 described above. Note, however, that the nature of any additional layer may affect performance of the resulting capacitor such as creating an undesirable series capacitance. Dielectric layer 513 contains a dielectric material. For one embodiment, dielectric layer 513 contains at least one metal oxide dielectric material. For another embodiment, dielectric layer 513 contains at least one dielectric material such as $Ba_zSr_{(1-z)}TiO_3$ [BST; where 0<x<1], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $Ta_2O_5$, $KNO_3$, $Al_2O_3$ or $LiNbO_3$. In an embodiment, dielectric layer includes a lanthanide oxide. In an embodiment, the dielectric layer includes $LiFO_2$, $ZrO_2$, or combinations thereof. In an embodiment, the dielectric layer includes a high k oxide. In an embodiment, the barrier layer has ∈ value of greater than 10. For a further embodiment, dielectric layer 513 contains $Ta_2O_5$. The dielectric layer 513 is deposited, in various embodiments, by any deposition technique, e.g., RF-magnetron sputtering, chemical vapor deposition (CVD), ALD, or other suitable deposition technique. As one example, a metal oxide, e.g., tantalum oxide, may be formed by depositing a layer of the metal component, e.g., tantalum, followed by annealing in an oxygen-containing ambient. As another example, the metal oxide may be deposited by metal organic chemical vapor deposition (MOCVD). Subsequent to formation, dielectric layer 513 may be annealed in an oxygen-containing ambient, such as an ambient containing $O_2$ or ozone, at a temperature within the range of approximately 200 to 800° C. The actual oxygen-containing ambient, concentration of oxygen species and annealing temperature may vary for the specific dielectric deposited. The bottom electrode 511 is generally not oxidized, or is only marginally oxidized, during formation or subsequent processing of the dielectric layer 513 due to the protection from the oxygen-containing ambient as provided by first barrier layer 514.

A second barrier layer 516 is formed overlying the dielectric layer 513. The second barrier layer 516 is shown to be directly adjoining the dielectric layer 513, but there is no prohibition to forming additional layers interposed between the second barrier layer 516 and the dielectric layer 513. Note, however, that the nature of any additional layer may affect performance of the resulting capacitor such as creating an undesirable series capacitance. The second barrier layer 516 is a conductive layer formed according to the enhanced ALD processes described herein. In an embodiment, the second barrier layer 516 includes a metal nitride material. In an embodiment, the second barrier layer 516 includes a refractory metal nitride material. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. For one embodiment, second barrier layer 516 contains a tantalum nitride material (TaN).

A top electrode 515 is deposited to form the top conductive layer or electrode of the capacitor. The top electrode 515 is shown to be directly adjoining the second barrier layer 516, but there is no prohibition to forming additional conductive layers interposed between the top electrode 515 and the second barrier layer 516. Top electrode 515 may be of any conductive material and generally follows the same guidelines as bottom electrode 511. Layers 511, 514, 513, 516, and 515 are patterned by techniques to a define capacitor 502 for a memory cell 500.

In the foregoing embodiments, the capacitor structures included a barrier layer interposed between the dielectric layer and each electrode. An example from these embodiments includes a metal layer/TaN/$Ta_2O_5$/TaN/a metal layer structure for bottom electrode/barrier layer/dielectric layer/barrier layer/top electrode. In an embodiment, only a single barrier layer is formed. That is, there is no requirement to use a barrier layer on each side of the dielectric layer as described above. As an example, where the bottom electrode is not susceptible to oxidation, the first barrier layer could be eliminated. An example of this embodiment includes a Pt/TaN/$Ta_2O_5$/ metal layer structure for bottom electrode/barrier layer/dielectric layer/top electrode. Similarly, where the dielectric and layers beneath the dielectric are not susceptible to oxidation, the second (top in FIG. 5) barrier layer is eliminated.

In an embodiment, at least one of the electrode layers 511 and 515 is formed according to the present invention. In this embodiment, there is no barrier layer intermediate the at least one electrode layer 511 or 515 formed according to the invention. If both of the electrode layers 511 and 515 are formed according to the present invention, then the capacitor is a metal-insulator-metal (MIM) capacitor. In an embodiment, the MIM capacitor has at least one TaN layer as an electrode layer, a dielectric layer and another electrode layer.

In addition, FIG. 5 was used to aid the understanding of the accompanying text. However, FIG. 5 is not drawn to scale and relative sizing of individual features and layers are not necessarily indicative of the relative dimensions of such individual features or layers in application. As an example, the bottom electrode 511 may have a physical thickness of five times that of the dielectric layer 513 in some applications. Accordingly, the drawings are not to be used for dimensional characterization.

While the foregoing embodiments of capacitor structures may be used in a variety of integrated circuit devices, they are particularly suited for use as storage capacitors of memory cells found in dynamic memory devices.

Figure 6:
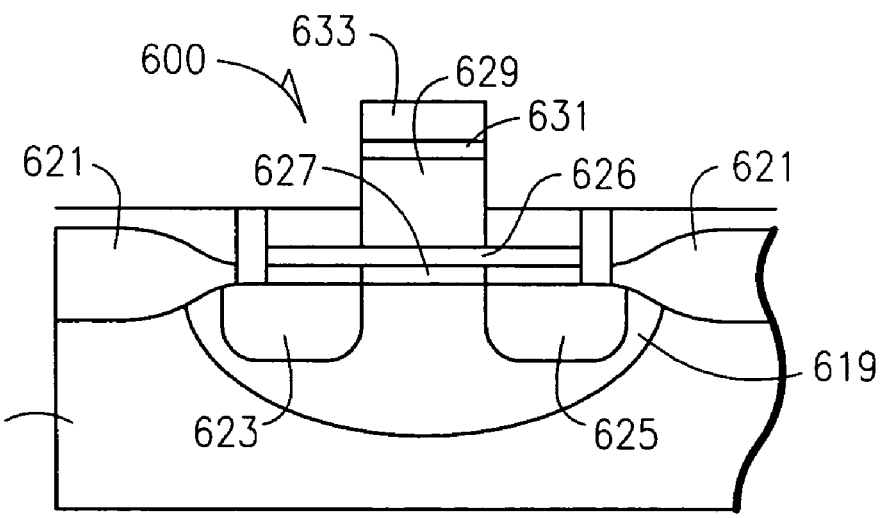
FIG. 6 is an integrated circuit transistor according to the present invention.

FIG. 6 shows a transistor 600 including an ALD layer according to the present invention. In an embodiment, the transistor 600 is used as an access transistor to the memory cell 500. Transistor 600 is formed on a substrate 605 in an active area including a doped well 619 covered by a field oxide region 621. The field oxide region 621 has a thin center portion 627 and thicker outer portions. A first source/drain region 623 is formed in the well 619 beneath the center portion 627 of field oxide region 621. A second source/drain region 625 is formed in the well 619 beneath the center portion 627 of field oxide region 621. The field oxide center portion 627 forms the gate oxide that is positioned intermediate the source/drain regions 623, 625 above the channel region of the well 619. In an embodiment, a barrier layer 626 is formed according to the present invention over the gate oxide 627. The gate electrode 629 is formed over the barrier layer 626. The barrier layer 626 is adapted to prevent dopants, such as boron, in the gate electrode 629 from diffusing into the gate oxide layer 627, the source/drain 623 and the source/drain 625. The barrier layer 626 also prevents reactions between the gate electrode 629 and the gate oxide layer 627, prevents migration of dopants from the gate electrode 629 to other areas of the semiconductor device, prevents oxidation of the gate electrode 629 and prevents the formation of silicides on the gate electrode.

In an embodiment, a further barrier layer 631 is formed according to the present invention over the gate electrode 629. A line or interconnect 633 is formed on the barrier layer 631. The line 633 is adapted to control the gate electrode 629 and hence operation of the transistor 600 by conducting a control signal from a control circuit (not shown) to the gate. Barrier layer 631 is adapted to prevent diffusion of elements from either the line 633 or gate electrode 629 to the other of the line 633 and gate electrode 629.

Figure 7:
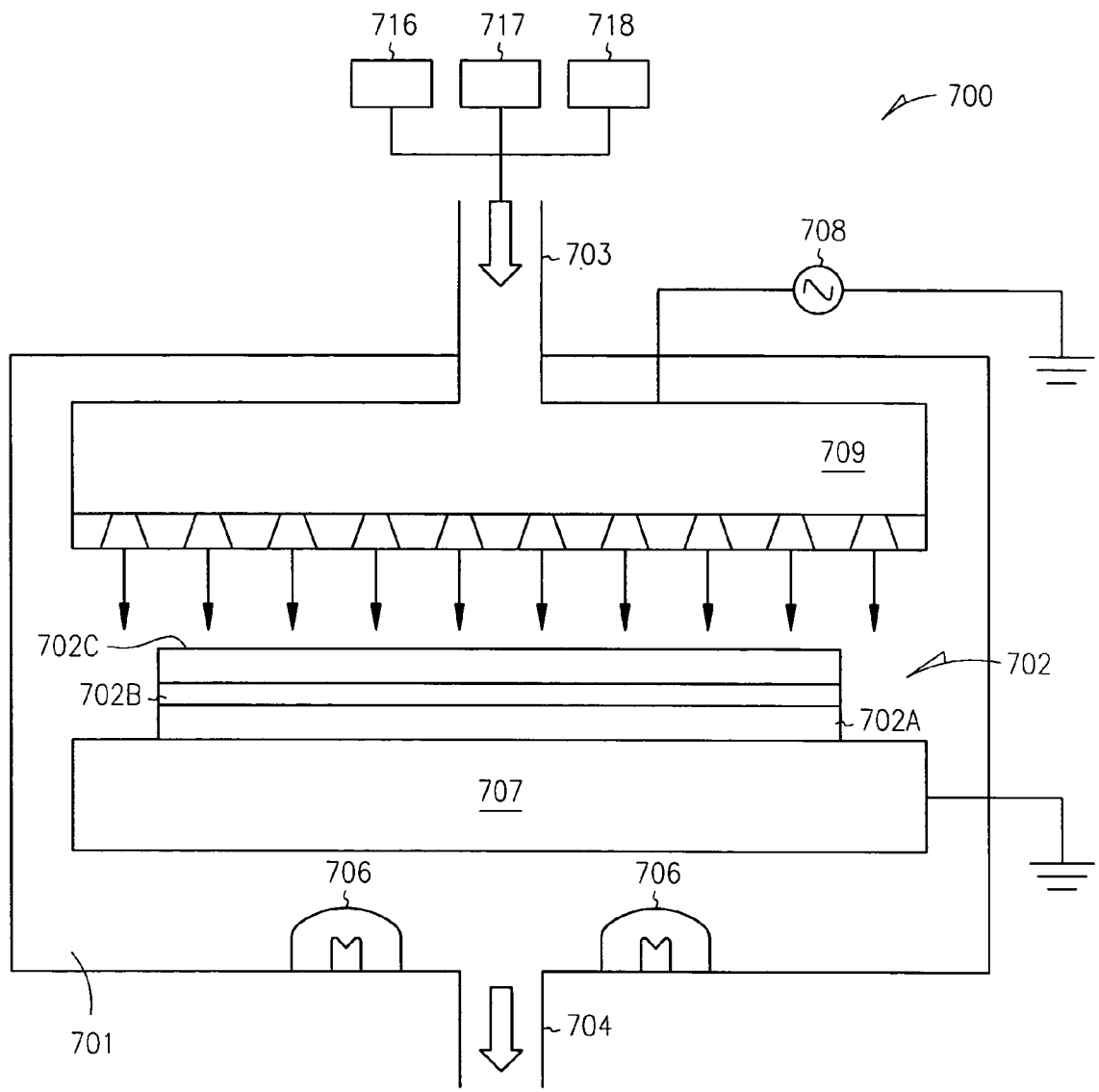
FIG. 7 is a view of a reactor for use with the process of the present invention.

FIG. 7 depicts one embodiment of an atomic layer deposition (ALD) reactor 700 suitable for practicing the present invention. FIG. 7 is provided for illustrative purposes and the invention may be practiced with other reactors. The embodiment shown in FIG. 7 includes a chamber 701 that is a pressure-sealed compartment for mounting a substrate 702 on susceptor 707. It will be appreciated that susceptor 707, in an embodiment, is adapted to hold a plurality of substrates. Chamber 701 is typically manufactured from aluminum and is designed to contain a low-pressure environment around substrate 702 as well as to contain process gases, exhaust gases, and heat or plasma energy within chamber 701. The illustrated substrate 702 includes a substrate base 702A on which are deposited first and second layers 702B and 702C. It is understood that the surface of the substrate 702 at various times during fabrication includes recesses and non-planar surfaces. Inlet gas manifold 703 supplies process gases, for example, precursor gases and purge gases, at controlled flow rates to substrate 702. Inlet gas manifold 703 includes a diffuser 709 that spreads the inlet gas across the surface of the substrate(s). A first source of precursor gas 716 is connected to manifold 703. A source of purge gas 717 is connected to manifold 703. A second source of precursor gas 718 is also connected to manifold 703. Carrier gases, such as helium, argon or nitrogen, may also be supplied in conjunction with the gases supplied by the manifold as is known and understood by one of ordinary skill in the art. Chamber 701 also incorporates a pumping system (not shown) for exhausting spent gases from chamber 701 through exhaust port 704.

ALD reactor 700 includes means for supplying energy to the reactable constituents or compounds in the process gases in chamber 701 on the surface of the substrate 702. The supplied energy causes the reactable constituents to react or decompose and deposit a thin film onto an upper surface of substrate 702. In one embodiment, the supplied energy includes thermal energy supplied by heat lamps 706. Heat lamps 706 are adapted to heat the substrate and/or chamber 701 according to the teachings of the present invention. In the illustrated example, lamps 706 are positioned in the base of chamber 701. Heat lamps 706 emit a significant amount of near-infrared radiation that passes through susceptor 707 to heat substrate 702. Alternatively, susceptor 707 is heated by heat lamps 706 and substrate 702 is heated by conduction from susceptor 707. The heat lamps 706 may be placed at alternate locations according to the parameters of the specific deposition process being performed according to the present invention.

Another embodiment supplies reaction energy by a radio frequency (RF) generator 708 as shown in FIG. 7. RF generator 708 creates a RF field between substrate 702 and an anode. In the embodiment shown in FIG. 7, susceptor 707 is grounded while the RF signal is applied to a process gas manifold 709. Alternative and equivalent ALD reactor designs will be understood by reading the disclosure. An RF anode may be provided separately (not shown) and process gas manifold 709 may be electrically isolated from the RF supply. For example, the RF signal is applied to susceptor 707 and process gas manifold 709 is grounded. The RF generator 708 is adapted to produce sufficient energy to create a plasma within the chamber 701 in accordance with the present invention.

In general, the energy sources 706 and 708 are intended to provide sufficient reaction energy in a region near the surface of substrate 702 to cause decomposition and/or reaction of the constituents of the present gas to deposit the first element, e.g., the metal species, in the process gases onto a surface of the substrate. One of ordinary skill in the art will understand upon reading the disclosure that any one, combination, or equivalent of the above can be employed to provide the necessary reaction energy.

ALD reactor 700 is illustrated as a single wafer reactor, but it should be understood that the invention is applicable to batch reactors.

Furthermore, ALD reactor 700 includes associated control apparatus (not shown) for detecting, measuring and controlling process conditions within ALD reactor 700. Associated control apparatus include, as examples, temperature sensors, pressure transducers, flow meters, control valves, and control systems. Control systems include computational units such as programmable logic controls, computers and processors. Associated control apparatus further include other devices suitable for the detection, measurement and control of the various process conditions described herein.

One of ordinary skill in the art will comprehend other suitable reactors for practicing the invention described in this application, for example the reactors described in U.S. Pat. Nos. 5,879,459 and 6,305,314, herein incorporated by reference.

Figure 8:
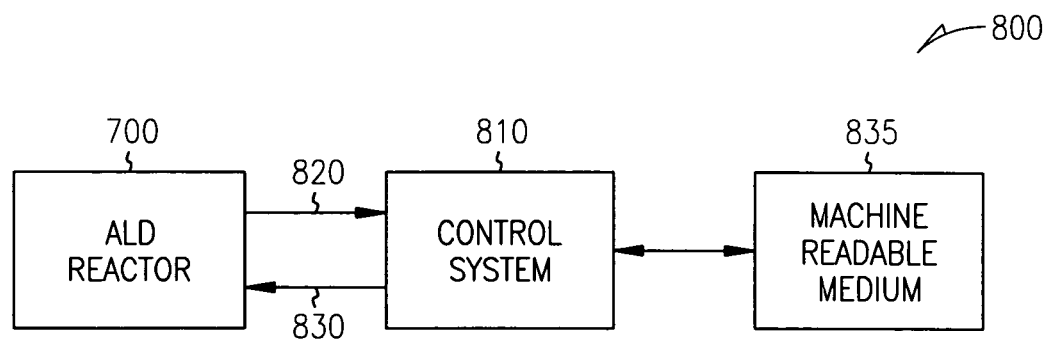
FIG. 8 is a view of a reactor system for use with the process of the present invention.

FIG. 8 represents an ALD system 800 suitable for practicing the invention. ALD system 800 contains the ALD reactor 700 and a control system 810. ALD reactor 700 and control system 810 are in communication such that process information is passed from ALD reactor 700 to control system 810 through communication line 820, and process control information is passed from control system 810 to ALD reactor 700 through communication line 830. It is noted that communication lines 820 and 830 may represent only one physical line, in which communications are bidirectional.

The control system 810 includes, integrally or separable therefrom, a machine readable media 835 which contains instructions for performing the present invention. Media 835, in various embodiments, includes electrical, magnetic, optical, mechanical, etc. storage device(s) that stores instructions that are read by control system 810. Such storage devices include magnetic disks and tape, optical disks, computer memory, etc. Control system 810 may also include a processor (not shown) for issuing instructions to control reactor 700 based upon instructions read from machine readable media 835.

Memory Devices

Figure 9:
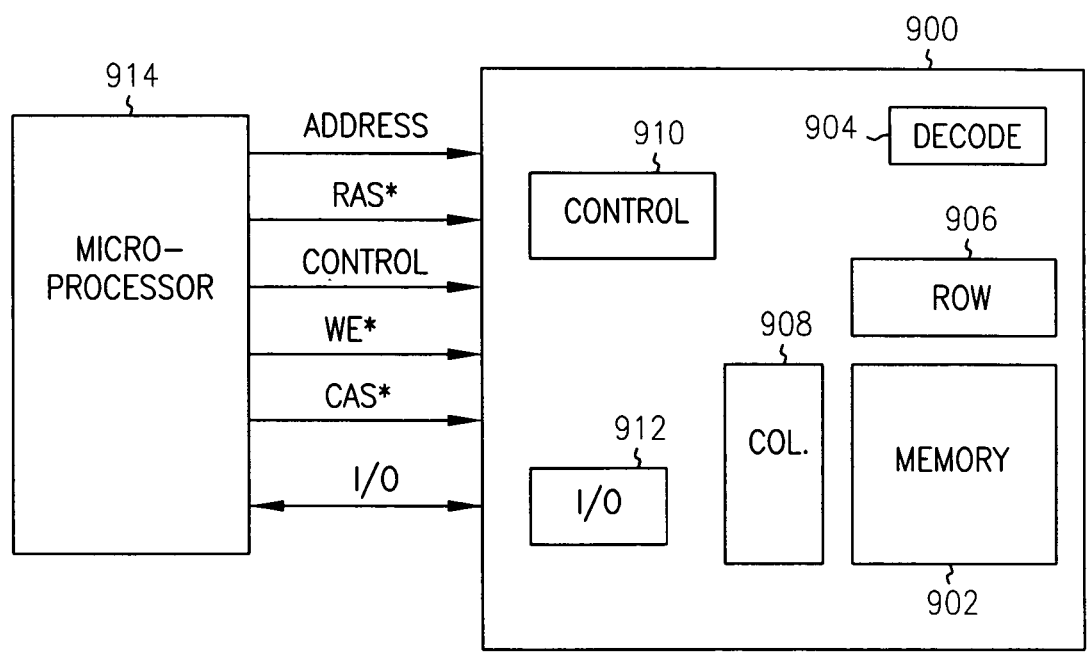
FIG. 9 is a view of a memory system containing a semiconductor device having an enhanced ALD layer according to the present invention.

FIG. 9 is a simplified block diagram of a memory device 900 according to an embodiment of the invention. The memory device 900 includes an array of memory cells 902, address decoder 904, row access circuitry 906, column access circuitry 908, control circuitry 910, and Input/Output circuit 912. The memory is operably coupled to an external microprocessor 914, or memory controller for memory accessing. The memory device 900 receives control signals from the processor 914, such as WE*, RAS* and CAS* signals. The memory device 900 stores data which is accessed via I/O lines. It will be appreciated by those skilled in the art that additional circuitry and control signals can be provided, and that the memory device of FIG. 9 has been simplified to help focus on the invention. At least one of the memory cells, transistors, or associated circuitry has an integrated circuit structure or element in accordance with the present invention, i.e., an ALD layer formed according to the present invention.

It will be understood that the above description of a memory device is intended to provide a general understanding of the memory and is not a complete description of all the elements and features of a specific type of memory, such as DRAM (Dynamic Random Access Memory). Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Semiconductor Dies

Figure 10:
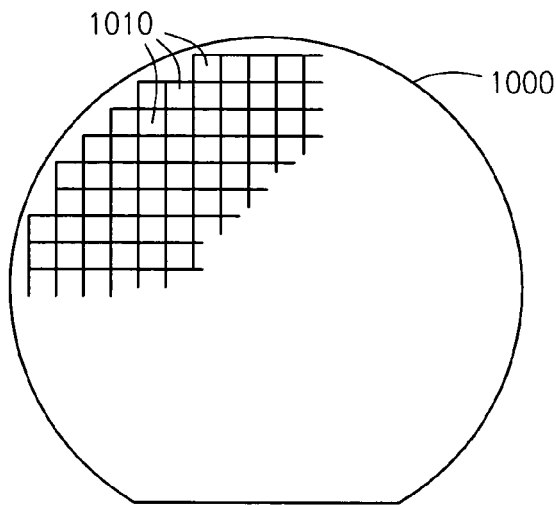
FIG. 10 is a view of a wafer containing semiconductor dies, each having a semiconductor device with an enhanced ALD layer of the present invention.

With reference to FIG. 10, for one embodiment, a semiconductor die 1010 is produced from a wafer 1000. A die 1010 is an individual pattern, typically rectangular, on a substrate or wafer 1000 that contains circuitry, or integrated circuit devices, to perform a specific function. A semiconductor wafer 1000 will typically contain a repeated pattern of such dies 1010 containing the same functionality. Die 1010 contains circuitry for the inventive memory device, as discussed above. Die 1010 may further contain additional circuitry to extend to such complex devices as a monolithic processor with multiple functionality. Die 1010 is typically packaged in a protective casing (not shown) with leads extending therefrom (not shown) providing access to the circuitry of the die for unilateral or bilateral communication and control. Each die 1010 includes at least one ALD layer according to the present invention.

Circuit Modules

Figure 11:
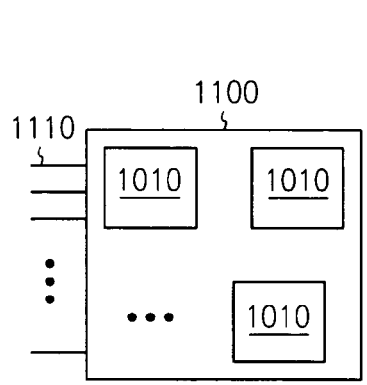
FIG. 11 is a block diagram of a circuit module that has a semiconductor device with an enhanced ALD layer of the present invention.

As shown in FIG. 11, two or more dies 1010 may be combined, with or without protective casing, into a circuit module 1100 to enhance or extend the functionality of an individual die 1010. Circuit module 1100 may be a combination of dies 1010 representing a variety of functions, or a combination of dies 1010 containing the same functionality. One or more dies 1010 of circuit module 1100 contain at least one ALD layer in accordance with the present invention.

Some examples of a circuit module include memory modules, device drivers, power modules, communication modems, processor modules and application-specific modules, and may include multilayer, multichip modules. Circuit module 1100 may be a subcomponent of a variety of electronic systems, such as a clock, a television, a cell phone, a personal computer, an automobile, an industrial control system, an aircraft and others. Circuit module 1100 will have a variety of leads 1110 extending therefrom and coupled to the dies 1010 providing unilateral or bilateral communication and control.

Figure 12:
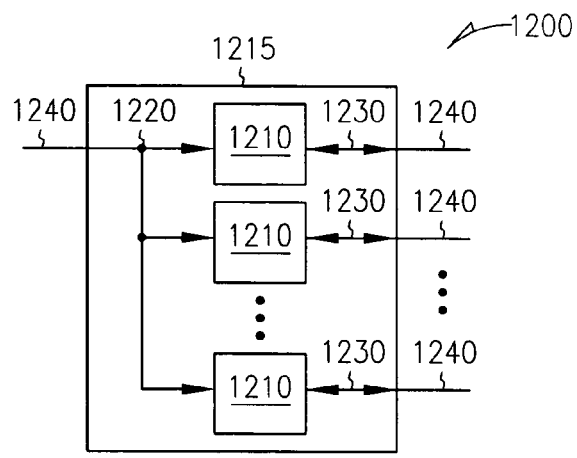
FIG. 12 is a block diagram of a memory module that has a semiconductor device with an enhanced ALD layer of the present invention.

FIG. 12 shows one embodiment of a circuit module as memory module 1200. Memory module 1200 contains multiple memory devices 1210 contained on support 1215, the number generally depending upon the desired bus width and the desire for parity. Memory module 1200 accepts a command signal from an external controller (not shown) on a command link 1220 and provides for data input and data output on data links 1230. The command link 1220 and data links 1230 are connected to leads 1240 extending from the support 1215. Leads 1240 are shown for conceptual purposes and are not limited to the positions shown in FIG. 9. At least one of the memory devices 1210 contains a ALD layer according to the present invention.

Electronic Systems

Figure 13:
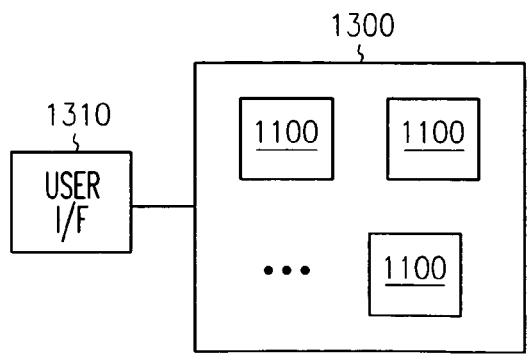
FIG. 13 is a block diagram of an electronic system that has a semiconductor device with an enhanced ALD layer of the present invention.

FIG. 13 shows one embodiment of an electronic system 1300 containing one or more circuit modules 1100. Electronic system 1300 generally contains a user interface 1310. User interface 1310 provides a user of the electronic system 1300 with some form of control or observation of the results of the electronic system 1300. Some examples of user interface 1310 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine, or other human-machine interfaces. User interface 1310 may further describe access ports provided to electronic system 1300. Access ports are used to connect an electronic system to the more tangible user interface components previously exemplified. One or more of the circuit modules 1100 may be a processor providing some form of manipulation, control or direction of inputs from or outputs to user interface 1310, or of other information either preprogrammed into, or otherwise provided to, electronic system 1300. As will be apparent from the lists of examples previously given, electronic system 1300 will often be associated with certain mechanical components (not shown) in addition to circuit modules 1100 and user interface 1310. It will be appreciated that the one or more circuit modules 1100 in electronic system 1300 can be replaced by a single integrated circuit. Furthermore, electronic system 1300 may be a subcomponent of a larger electronic system. It will also be appreciated that at least one of the memory modules 1100 contains a ALD layer according to the present invention.

Figure 14:
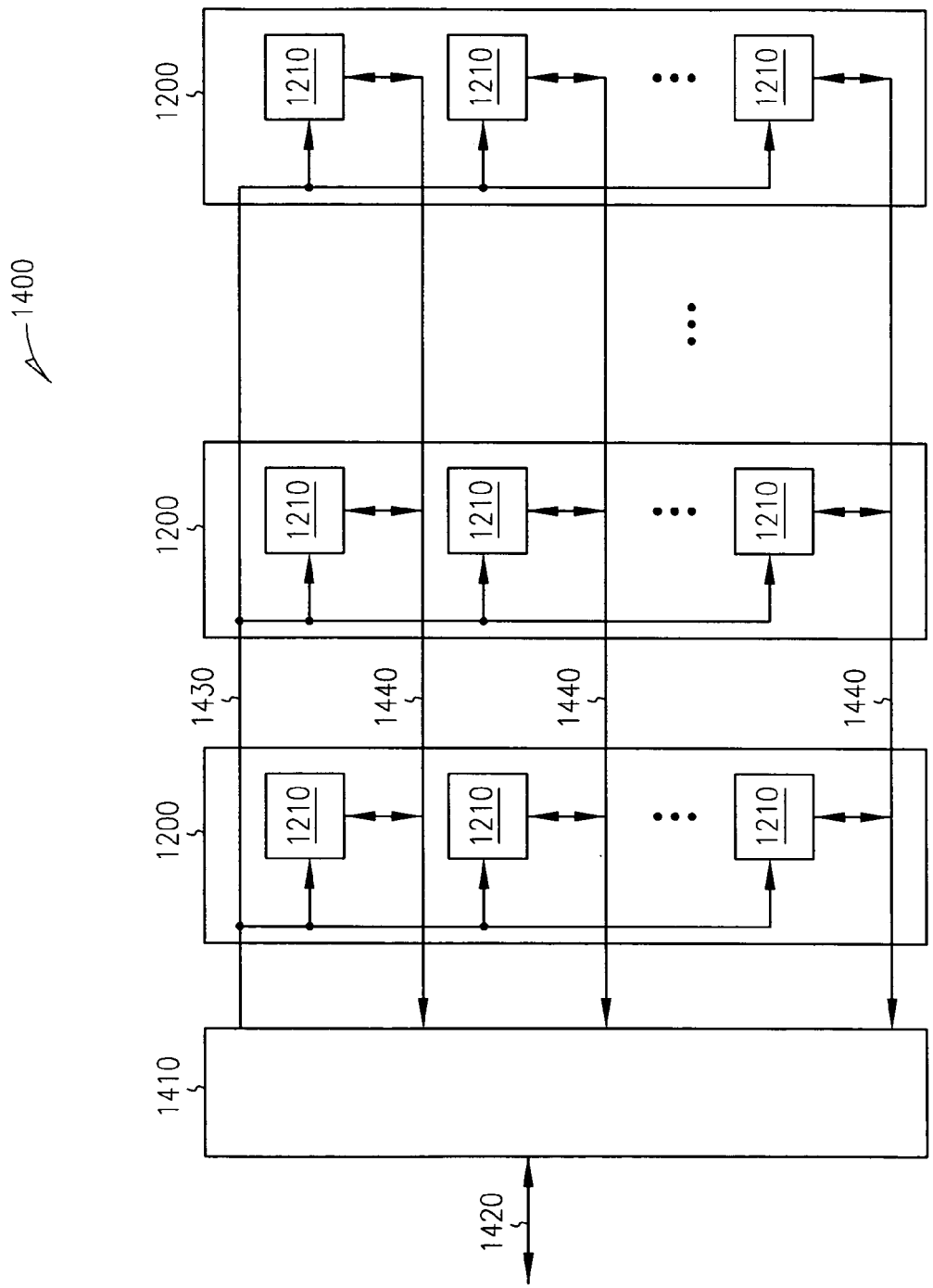
FIG. 14 is a block diagram of a memory system that has a semiconductor device with an enhanced ALD layer of the present invention.

FIG. 14 shows one embodiment of an electronic system as memory system 1400. Memory system 1400 contains one or more memory modules 1200 and a memory controller 1410. The memory modules 1200 each contain one or more memory devices 1210. At least one of memory devices 1210 contains an ALD layer according to the present invention. Memory controller 1410 provides and controls a bidirectional interface between memory system 1400 and an external system bus 1420. In an embodiment, the memory controller includes integrated circuits that includes an ALD layer according to the present invention. Memory system 1400 accepts a command signal from the external bus 1420 and relays it to the one or more memory modules 1200 on a command link 1430. Memory system 1400 provides for data input and data output between the one or more memory modules 1200 and external system bus 1420 on data links 1440.

Figure 15:
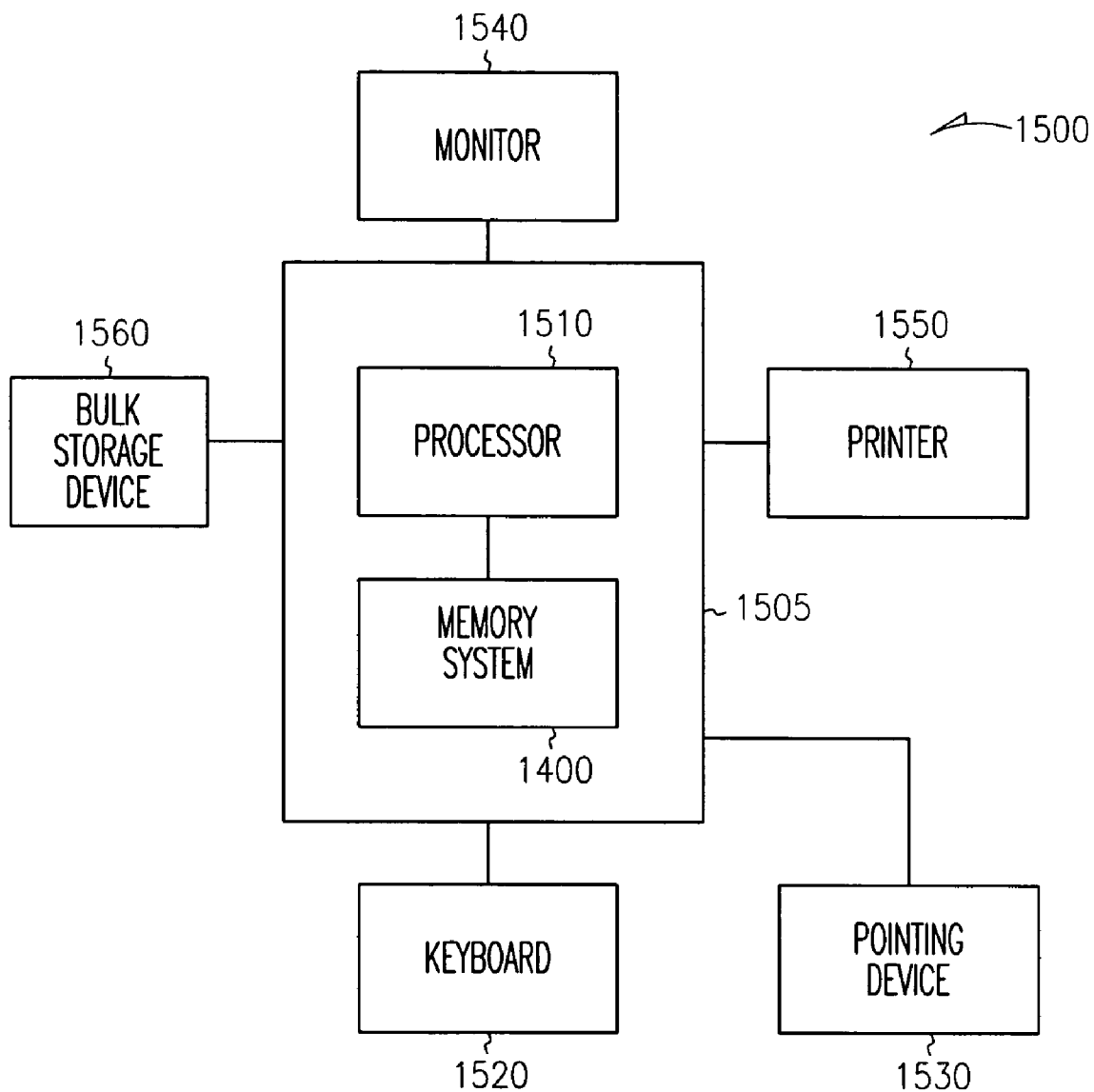
FIG. 15 is a block diagram of a computer system that has a semiconductor device with an enhanced ALD layer of the present invention.

FIG. 15 shows a further embodiment of an electronic system as a computer system 1500. Computer system 1500 contains a processor 1510 and a memory system 1400 housed in a computer unit 1505. Computer system 1500 is but one example of an electronic system containing another electronic system, i.e., memory system 1200, as a subcomponent. Computer system 1500 optionally contains user interface components. Depicted in FIG. 15 are a keyboard 1520, a pointing device 1530, a monitor 1540, a printer 1550 and a bulk storage device 1560. It will be appreciated that other components are often associated with computer system 1500 such as modems, device driver cards, additional storage devices, etc. It will further be appreciated that the processor 1510 and memory system 1400 of computer system 1500 can be incorporated on a single integrated circuit. Such single package processing units reduce the communication time between the processor and the memory circuit. It will be appreciated that at least one of the processor 1510 and memory system 1400 contains an ALD layer according to the present invention. In an embodiment, the printer 1550 or bulk storage device 1560 includes an ALD layer according to the present invention.

CONCLUSION

The present invention includes methods for producing improved IC structures as discussed herein. The present method uses enhanced atomic layer deposition. In an embodiment, the enhancement is the use of plasma energy during ALD. In an embodiment, the enhancement is the use of thermal energy during ALD.

The ALD uses a first precursor gas and purges the first precursor gas according to ALD processes. A plasma is created during the purging step to enhance the ALD process. A second precursor gas is provided to react with the remaining portion of the first precursor gas. The plasma disassociates the elements of the second precursor gas. This allows a disassociated element from the second precursor gas to react with at least one component of the first precursor gas at the substrate surface. The result is a layer with fewer impurities, e.g., unwanted elements, than would be formed by conventional PVD or CVD. Further, using the plasma to enhance the ALD process reduces the amount of impurities in an ALD layer formed according to the present invention. The plasma is initiated during the purge step as the second precursor pulse is of such a short duration that is the plasma is initiated during the second precursor gas pulse, the plasma will not be created fast enough to achieve the desired energy level to disassociate a component of the second precursor gas from the other components thereof. Initiating the plasma energy during the purge step results in an initial plasma of the purge gas, which in turn creates a plasma as soon as the second precursor gas flows into the chamber. Starting the plasma during the purge allows the plasma to stabilize before the second precursor flows in to the reaction chamber. The resulting structure has fewer impurities than conventional PVD, CVD, and ALD.

The structures that have metal layers formed according to the present invention do not have the depletion layers that are formed according to conventional PVD techniques. The depletion layer reduces capacitance of a capacitor, for example in a memory cell. Further, a TaN layer according to the present invention is an effective barrier layer, which allows the use of high work function materials, e.g., noble metals, platinum, rhodium, that are ineffective diffusion barriers. An ineffective diffusion barrier allows oxygen, silicon or other unwanted elements to diffuse through the layer during IC processing to change the chemical structure of layers below the barrier layer. An effective barrier layer prevents diffusion through the barrier layer during IC processing. Still further, it is believed that conventional IC processes do not teach an effective process for creating a TaN layer during IC processing.

In an embodiment, thermal energy is used to enhance ALD. The thermal energy assists in disassociating components of the precursor gases. The thermally enhanced ALD layer results in improved step coverage over PVD and CVD layers in both contact structures and hemispherical grain ("HSG") surfaces and containers. Further, the thermally enhanced ALD provides for greater thickness control over PVD. The thermally enhanced ALD layer is more thermodynamically stable than the PVD layers. Still further, PVD of TaN, i.e., sputter Ta and add ammonia ($NH_3$), results in a layer that has approximately 90% Ta and 10% N. Conventional processes that use only tantalum and silane result in a non-conductive layer of tantalum silicide. Thus, the present process provides for the formation of a conductive TaN layer using silane and ammonia as reactant gases.

We claim:

1. An integrated circuit capacitor, comprising:
   a first electrode;
   a second electrode;
   a dielectric intermediate the first electrode and the second electrode; and
   an atomic layer deposited, tantalum nitride layer adjacent to and distinct from one of the first electrode and the second electrode, the tantalum nitride barrier layer having a ratio of Ta:N of 1:1 with impurities of less than about 10%, wherein the tantalum nitride barrier layer has fluorine impurities of less than about 10%.

2. The capacitor of claim 1, wherein the at least one of the first electrode and the second electrode include platinum.

3. The capacitor of claim 1, wherein the at least one of the first electrode and the second electrode include rhodium.

4. The capacitor of claim 1, wherein the dielectric layer includes at least one of $Ba_zSr_{(1-z)}TiO_3$ [BST; where 0<z<1], $BaTiO_3$, $SrTiO_3$, $PbTiO_3$, $Pb(Zr,Ti)O_3$ [PZT], (Pb,La)(Zr,Ti)$O_3$ [PLZT], (Pb,La)$TiO_3$ [PLT], $Ta_2O_5$, $KNO_3$, $Al_2O_3$ and $LiNbO_3$.

5. The capacitor of claim 1, wherein the dielectric layer includes at least one of a high k oxide, a multilayer oxide and a doped oxide.

6. The capacitor of claim 1, wherein the first electrode includes a metal and the second electrode includes a metal.

7. The capacitor of claim 1, wherein the tantalum nitride barrier layer is a diffusion baffler layer.

8. The capacitor of claim 1, wherein the tantalum nitride barrier layer is an oxygen diffusion baffler layer.

9. The capacitor of claim 1, wherein the first electrode, the second electrode, the dielectric, and the tantalum nitride baffler layer form a memory cell.

10. An integrated circuit transistor, comprising:
    a source;
    a drain;
    a gate; and
    an atomic layer deposited, tantalum nitride layer adjacent to and distinct from at least one of the source, the drain and the gate, the tantalum nitride layer having a ratio of Ta:N of 1:1 with impurities of less than about 10%, wherein the tantalum nitride layer has fluorine impurities of less than about 10%.

11. The transistor of claim 10, wherein the tantalum nitride layer is a diffusion barrier layer.

12. The transistor of claim 10, wherein the tantalum nitride layer is an oxygen diffusion barrier layer.

13. An integrated circuit capacitor, comprising:
    a first electrode;
    a second electrode;
    a dielectric intermediate the first electrode and the second electrode; and
    an atomic layer deposited, tantalum nitride layer adjacent at least one of the first electrode and the second electrode, wherein the tantalum nitride layer has fluorine impurities of less than about 10%.

14. The capacitor of claim 13, wherein the at least one of the first electrode and the second electrode include platinum.

15. The capacitor of claim 13, wherein the at least one of the first electrode and the second electrode include rhodium.

16. The capacitor of claim 13, wherein the dielectric layer includes at least one of $Ba_zSr_{(1-z)}TiO_3$ [BST; where 0<z<1], $BaTiO_3$, $SrTiO_3$, $PbTiO_3$, $Pb(Zr,Ti)O_3$, (Pb,La)(Zr,Ti)$O_3$, (Pb,La)$TiO_3$, $Ta_2O_5$, $KNO_3$, $Al_2O_3$ and $LiNbO_3$.

17. The capacitor of claim 13, wherein the dielectric layer includes at least one of a high k oxide.

18. The capacitor of claim 13, wherein the first electrode includes a metal and the second electrode includes a metal.

19. The capacitor of claim 13, wherein the tantalum nitride layer is a diffusion barrier layer.

20. The capacitor of claim 13, wherein the tantalum nitride layer is an oxygen diffusion barrier layer.

21. The capacitor of claim 13, wherein the first electrode, the second electrode, the dielectric, and the tantalum nitride layer form a memory cell.

22. The capacitor of claim 13, wherein the tantalum nitride layer having a ratio of Ta:N of 1:1.

23. An integrated circuit transistor, comprising:
a source;
a drain;
a gate; and
an atomic layer deposited, tantalum nitride layer adjacent at least one of the source, the drain and the gate, wherein the tantalum nitride layer has fluorine impurities of less than about 10%.

24. The transistor of claim 23, wherein the tantalum nitride layer is a diffusion barrier layer.

25. The transistor of claim 24, wherein the tantalum nitride layer having a ratio of Ta:N of 1:1.

26. The transistor of claim 23, wherein the tantalum nitride layer is an oxygen diffusion barrier layer.

27. An integrated circuit capacitor, comprising:
a first electrode;
a second electrode;
a dielectric intermediate the first electrode and the second electrode; and
an atomic layer deposited, tantalum nitride layer adjacent one of the first electrode and the second electrode, the tantalum nitride layer having a ratio of Ta:N of 1:1, wherein the tantalum nitride layer has silicon impurities of less than about 5%.

28. An integrated circuit transistor, comprising:
a source;
a drain;
agate; and
an atomic layer deposited, tantalum nitride layer adjacent at least one of the source, the drain and the gate, the tantalum nitride layer having a ratio of Ta:N of 1:1 wherein the tantalum nitride layer has silicon impurities of less than about 5%.

29. The capacitor of claim 27, wherein the at least one of the first electrode and the second electrode include platinum.

30. The capacitor of claim 27, wherein the at least one of the first electrode and the second electrode include rhodium.

31. The capacitor of claim 27, wherein the dielectric layer includes at least one of barium, strontium and zirconium.

32. The capacitor of claim 27, wherein the dielectric layer includes at least a doped oxide.

33. The capacitor of claim 27, wherein the tantalum nitride layer is a diffusion barrier layer.

34. The transistor of claim 28, wherein the dielectric layer includes at least a doped oxide.

35. The transistor of claim 28, wherein the tantalum nitride layer is an oxygen diffusion barrier layer.

36. The transistor of claim 28, wherein the dielectric layer includes at least one of barium, strontium and zirconium.

37. The capacitor of claim 2, wherein the dielectric layer includes at least one of $Ba_zSr_{(1-z)}TiO_3$ [BST; where $0<z<1$], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $Ta_2O_5$, $KNO_3$, $Al_2O_3$ and $LiNbO_3$.

38. The capacitor of claim 2, wherein the dielectric layer includes at least one of a high k oxide, a multilayer oxide and a doped oxide.

39. The capacitor of claim 38, wherein the tantalum nitride barrier layer is a diffusion barrier layer.

40. The capacitor of claim 8, wherein the first electrode includes a metal and the second electrode includes a metal.

41. The capacitor of claim 40, wherein the tantalum nitride barrier layer is an oxygen diffusion barrier layer.

42. The capacitor of claim 41, wherein the first electrode, the second electrode, the dielectric, and the tantalum nitride barrier layer form a memory cell.

43. The transistor of claim 11, wherein the tantalum nitride layer is an oxygen diffusion barrier layer.

* * * * *

UNITED STATES PATENT AND TRADEMARK OFFICE
CERTIFICATE OF CORRECTION

PATENT NO. : 7,279,732 B2  Page 1 of 1
APPLICATION NO. : 10/854593
DATED : October 9, 2007
INVENTOR(S) : Meng et al.

It is certified that error appears in the above-identified patent and that said Letters Patent is hereby corrected as shown below:

In column 18, line 22, in Claim 7, delete "baffler" and insert -- barrier --, therefor.

In column 18, line 24, in Claim 8, delete "baffler" and insert -- barrier --, therefor.

In column 18, line 27, in Claim 9, delete "baffler" and insert -- barrier --, therefor.

In column 19, line 33, in Claim 28, delete "agate;" and insert -- a gate; --, therefor.

Signed and Sealed this

Eighteenth Day of December, 2007

JON W. DUDAS
*Director of the United States Patent and Trademark Office*